(12) United States Patent
Terai et al.

(10) Patent No.: US 9,231,114 B2
(45) Date of Patent: Jan. 5, 2016

(54) NONVOLATILE SEMICONDUCTOR MEMORY DEVICE

(71) Applicant: KABUSHIKI KAISHA TOSHIBA, Minato-ku (JP)

(72) Inventors: Masaya Terai, Kanagawa (JP); Shigeki Hattori, Kanagawa (JP); Takatoshi Watanabe, Kanagawa (JP); Masakazu Yamagiwa, Kanagawa (JP); Wangying Lin, Kanagawa (JP); Koji Asakawa, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 141 days.

(21) Appl. No.: 13/930,183

(22) Filed: Jun. 28, 2013

(65) Prior Publication Data
US 2014/0231897 A1 Aug. 21, 2014

Related U.S. Application Data

(60) Provisional application No. 61/767,411, filed on Feb. 21, 2013.

(51) Int. Cl.
| H01L 29/792 | (2006.01) |
| H01L 29/423 | (2006.01) |
| G11C 13/00 | (2006.01) |
| H01L 21/28 | (2006.01) |
| G11C 16/04 | (2006.01) |
| H01L 51/00 | (2006.01) |

(52) U.S. Cl.
CPC .......... *H01L 29/792* (2013.01); *G11C 13/0014* (2013.01); *G11C 13/0016* (2013.01); *H01L 29/4234* (2013.01); *G11C 16/0483* (2013.01); *G11C 2213/53* (2013.01); *G11C 2213/71* (2013.01); *G11C 2213/75* (2013.01); *H01L 21/28282* (2013.01); *H01L 51/0077* (2013.01)

(58) Field of Classification Search
None
See application file for complete search history.

(56) References Cited

U.S. PATENT DOCUMENTS

| 7,132,678 B2 | 11/2006 | Kagan et al. |
| 2008/0067504 A1 | 3/2008 | Park et al. |

(Continued)

FOREIGN PATENT DOCUMENTS

| JP | 2007-524989 | 8/2007 |
| JP | 2008-78653 | 4/2008 |

(Continued)

OTHER PUBLICATIONS

U.S. Appl. No. 14/022,756, filed Sep. 10, 2013, Nishizawa, et al.

(Continued)

*Primary Examiner* — Sonya D McCall Shepard
(74) *Attorney, Agent, or Firm* — Oblon, McClelland, Maier & Neustadt, L.L.P.

(57) ABSTRACT

A nonvolatile semiconductor memory device according to an embodiment includes: a semiconductor layer; a block insulating layer; an organic molecular layer, which is formed between the semiconductor layer and the block insulating layer, and contains first organic molecules and second organic molecules, and in which the first organic molecule has a first alkyl chain or a first alkyl halide chain on the semiconductor layer side and a charge trapping unit on the block insulating layer side, and the second organic molecule has a second alkyl chain or a second alkyl halide chain on the semiconductor layer side and a hydroxy group, an ether group, a carboxyl group or an ester group on the block insulating layer side; and a control gate electrode formed on the block insulating layer.

6 Claims, 16 Drawing Sheets

(56) References Cited

U.S. PATENT DOCUMENTS

| | | |
|---|---|---|
| 2012/0112171 A1* | 5/2012 | Hattori et al. .................. 257/40 |
| 2012/0241713 A1 | 9/2012 | Nishizawa et al. |
| 2013/0248962 A1 | 9/2013 | Morota et al. |

FOREIGN PATENT DOCUMENTS

| | | |
|---|---|---|
| JP | 2008-172059 | 7/2008 |
| JP | 2012-104675 | 5/2012 |
| JP | 2012-174805 | 9/2012 |
| JP | 2012-204433 | 10/2012 |
| JP | 2012-204434 | 10/2012 |
| JP | 2013-197363 A | 9/2013 |
| WO | WO 2012/127863 A1 | 9/2012 |

OTHER PUBLICATIONS

U.S. Appl. No. 13/934,784, filed Jul. 3, 2013, Hattori, et al.
U.S. Appl. No. 13/602,523, filed Sep. 4, 2012, Misako Morota, et al.
Meng Li, et al., "Atomic Layer Deposition of Aluminum Oxide on Carboxylic Acid-Terminated Self-Assembled Monolayers", Langmuir 2009, vol. 25, 2009, pp. 1911-1914.
U.S. Appl. No. 14/641,746, filed Mar. 9, 2015, Terai, et al.

* cited by examiner

FIG.4A

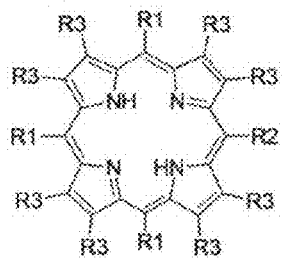

R1, R2, and R3 can be selected independently of one another.
R1, R2, and R3 might be the same.
At least one of R1 through R3 is bound to connecting unit 26c.

FIG.4B

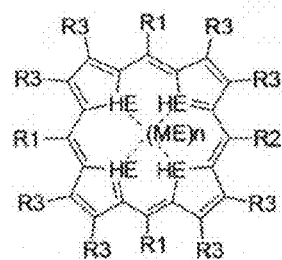

R1, R2, and R3 can be selected independently of one another.
R1, R2, and R3 might be the same.
At least one of R1 through R3 is bound to connecting unit 26c.
HE: Hetero atom
ME: Metal atom (Zn, Ti, Cu, Ir, Ru, Ni, Co, Li, Mn, Mg)
n=0, 1

FIG.4C

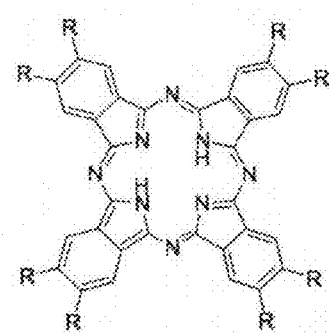

FIG.4D

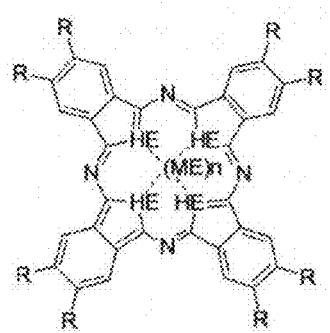

HE: Hetero atom
ME: Metal atom (Zn, Ti, Cu, Ir, Ru, Ni, Co, Li, Mn, Mg)
n=0, 1
At least one of R is bound to connecting unit 26c.

FIG.12
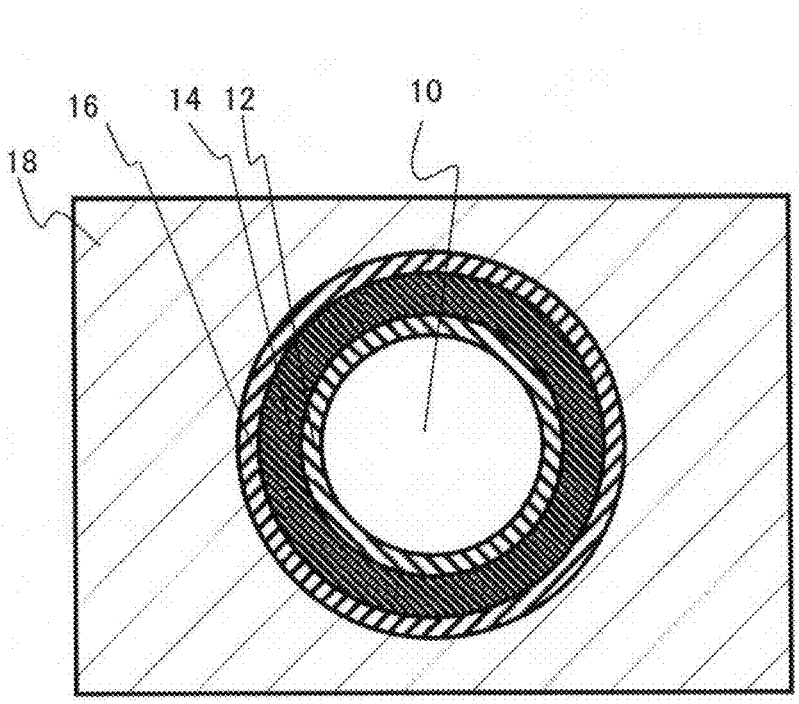
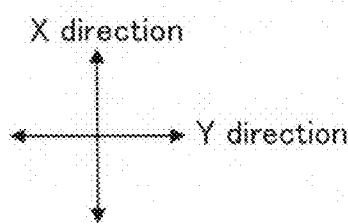

ed on Feb. 21, 2013, the entire contents of which are incorporated herein by reference.

NONVOLATILE SEMICONDUCTOR MEMORY DEVICE

CROSS-REFERENCE TO RELATED APPLICATION

This application is based upon and claims the benefit of priority from U.S. Provisional Application No. 61/767,411, filed on Feb. 21, 2013, the entire contents of which are incorporated herein by reference.

FIELD

Embodiments described herein generally relate to a nonvolatile semiconductor memory device.

BACKGROUND

As a method for realizing reduced bit cost of a nonvolatile semiconductor memory device and also enhancing memory performance thereof, scaling down of a memory cell is promising. However, scaling down of the memory cell has become technically difficult.

It has thus been proposed to use organic molecules for a charge trapping layer. Because various organic molecules can be formed by organically synthesize a variety of molecular structures and substituent groups, desired electrochemical properties can be applied to the organic molecules. And structural unit of the organic molecules is small. Therefore, the organic molecules may realize further scaling-down of the memory cell. When the organic molecules are used for the charge trapping layer, a monolayer is often applied because of its film uniformity and small thickness. In particular, organic molecules that form the monolayer in a self-assembling manner are often selected.

However, the surface of the organic molecular film often has hydrophobic (lipophilic) properties. For example, even when it is attempted to form an oxide film on this organic molecular film by Atomic Layer Deposition (ALD), an oxide film with inferior film quality is formed due to lack of hydroxyl groups that serve as reactivity sources in ALD. The oxide film with inferior film quality has a large leakage current and a low break down voltage. This thus brings about problems of degradation in data retention time for the memory cell and degradation in reliability.

BRIEF DESCRIPTION OF THE DRAWINGS

FIGS. 4A to 4D are diagrams each exemplifying a molecular structure of a charge trapping unit according to the first embodiment;

FIG. 12 is an X-Y sectional view of the nonvolatile semiconductor memory device of FIG. 17;

DETAILED DESCRIPTION

Figure 1:
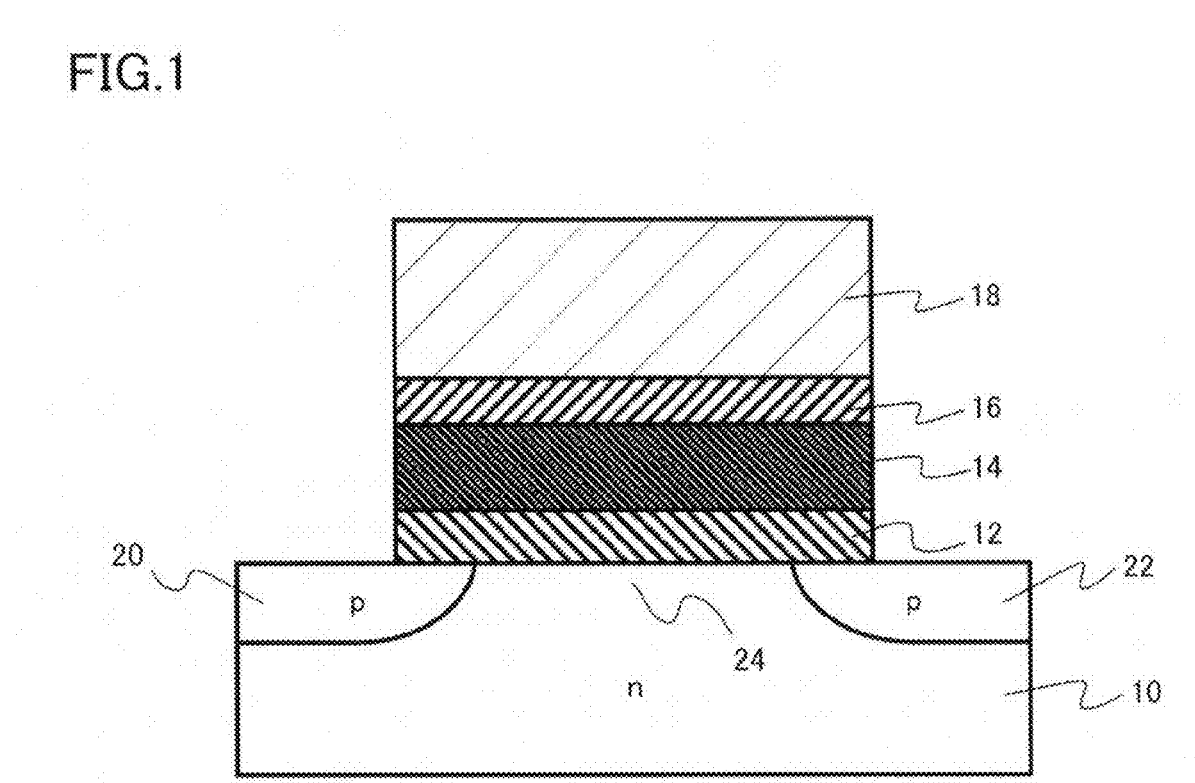
FIG. 1 is a sectional view of a memory cell unit of a nonvolatile semiconductor memory device according to a first embodiment.

A nonvolatile semiconductor memory device according to an embodiment includes: a semiconductor layer; a block insulating layer; an organic molecular layer, which is formed between the semiconductor layer and the block insulating layer, and contains first organic molecules and second organic molecules, and in which the first organic molecule has a first alkyl chain or a first alkyl halide chain on the semiconductor layer side and a charge trapping unit on the block insulating layer side, and the second organic molecule has a second alkyl chain or a second alkyl halide chain on the semiconductor layer side and a hydroxy group, an ether group, a carboxyl group or an ester group on the block insulating layer side; and a control gate electrode formed on the block insulating layer.

Hereinafter, embodiments will be described with reference to the drawings.

First Embodiment

A nonvolatile semiconductor memory device according to the present embodiment is provided with a semiconductor layer, a block insulating layer, and an organic molecular layer formed between the semiconductor layer and the block insulating layer. Further, it is provided with a control gate electrode formed on the block insulating layer. The organic molecular layer contains first organic molecules and second organic molecules. The first organic molecule has a first alkyl chain or a first alkyl halide chain on the semiconductor layer side and a charge trapping unit on the block insulating layer side. The second organic molecule has a second alkyl chain or a second alkyl halide chain on the semiconductor layer side and a hydroxy group, an ether group, a carboxyl group or an ester group on the block insulating layer side.

Further, the device is provided with a tunnel insulating layer formed between the semiconductor layer and the organic molecular layer. The first alkyl chain or the first alkyl halide chain and the second alkyl chain or the second alkyl halide chain are bonded to the tunnel insulating layer.

The nonvolatile semiconductor memory device according to the present embodiment is provided with charge trapping molecules (first organic molecules) each having a charge trapping unit in an organic molecular layer to serve as an charge trapping layer, and seed molecules (second organic molecules) each having a functional group that can be a reaction source in ALD. One end of each of the charge trapping molecule and the seed molecule is chemically bonded to the tunnel insulating layer. Further, the other end of the seed molecule has a functional group that can be chemically bonded to the block insulating layer formed on the organic molecular layer, and a majority of functional groups are chemically bonded to the block insulating layer.

In the nonvolatile semiconductor memory device according to the present embodiment, a high-quality block insulating layer can be made by provision of the above configuration. This provides improved insulation properties between the charge trapping unit and the control gate electrode, thereby improving data retention properties. This also leads to an improvement in reliability of the block insulating layer.

Figure 2:
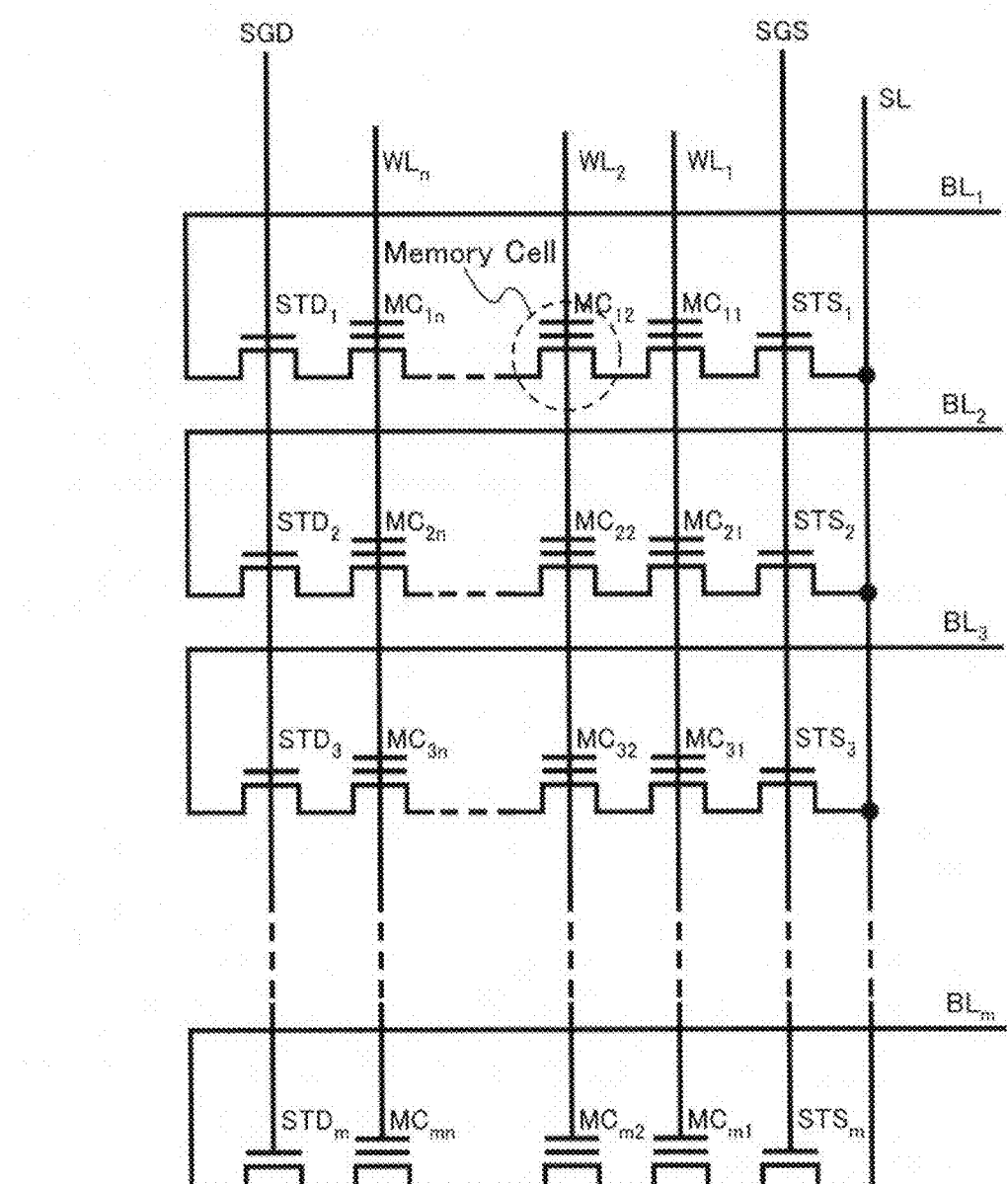
FIG. 2 is a circuit diagram of a memory cell array of the nonvolatile semiconductor memory device according to the first embodiment.

FIG. 1 is a sectional view of a memory cell unit of the nonvolatile semiconductor memory device according to the present embodiment. FIG. 2 is a circuit diagram of a memory cell array of the nonvolatile semiconductor memory device according to the present embodiment. The nonvolatile semiconductor memory device according to the present embodiment is a NAND nonvolatile semiconductor memory device.

As shown in FIG. 2, for example, the memory cell array is made up of memory cell transistors $MC_{11}$ to $MC_{1n}$, $MC_{21}$ to $MC_{2n}$, ..., and $MC_{m1}$ to $MC_{mn}$ as m×n (m and n are integers) transistors having a floating-gate structure. In the memory cell array, these memory cell transistors are arrayed in a column direction and in a row direction, and a plurality of memory cell transistors are thereby arranged in a matrix form.

In the memory cell array, for example, the memory cell transistors $MC_{11}$ to $MC_{1n}$ and select gate transistors $STS_1$ and $STD_1$ are series-connected, to form a NAND string (memory string) as a cell unit.

A drain region of the select gate transistor $STS_1$ for selecting the memory cell transistors $MC_{11}$ to $MC_{1n}$ is connected to a source region of the memory cell transistor $MC_{11}$ located at the end of the array of the series-connected group of the memory cell transistors $MC_{11}$ to $MC_{1n}$. Further, a source region of the select gate transistor $STD_1$ for selecting the memory cell transistors $MC_{11}$ to $MC_{1n}$ is connected to a drain region of the memory cell transistor $MC_{1n}$ located at the end of the array of the series-connected group of the memory cell transistors $MC_{11}$ to $MC_{1n}$.

Select gate transistors $STS_2$ to $STS_m$, memory cell transistors $MC_{21}$ to $MC_{2n}$, ..., and $MC_{m1}$ to $MC_{mn}$, and select gate transistors $STD_2$ to $STD_m$ are also series-connected respectively, to constitute NAND strings.

A common source line SL is connected to the sources of the select gate transistors $STS_1$ to $STS_m$. The memory cell transistors $MC_{11}$, $MC_{21}$, ..., and $MC_{m1}$, the memory cell transistors $MC_{12}$, $MC_{22}$, ..., and $MC_{m2}$, ... and the memory cell transistors $MC_{1n}$, $MC_{2n}$, ..., and $MC_{mn}$, are each connected by word lines $WL_1$ to $WL_n$ which control operating voltages to be applied to the control gate electrodes.

Further provided are a common select gate line SGS for the select gate transistors $STS_1$ to $STS_m$ and a common select gate line SGD for the select gate transistors $STD_1$ to $STD_m$.

It is to be noted that peripheral circuits, not shown, are formed on the periphery of the memory cell array of FIG. 2.

FIG. 1 shows a cross section of a memory cell in the memory cell array shown in FIG. 2, e.g., a memory cell surrounded by a dashed line in FIG. 2. In the present embodiment, a case where a transistor of the memory cell is a p-type transistor having holes as carriers will be described as an example.

The memory cell is formed, for example, on the n-type silicon semiconductor layer 10 containing n-type impurities. A tunnel insulating layer 12 is provided on the silicon semiconductor layer 10, an organic molecular layer (charge trapping layer) 14 is provided on the tunnel insulating layer 12, a block insulating layer 16 is provided on the organic molecular layer 14, and a control gate electrode 18 is provided on the block insulating layer 16. A source region 20 and a drain region 22 are formed in the semiconductor layer 10 on both sides of the control gate electrode 18. A region below the control gate electrode 18 in the semiconductor layer 10 is a channel region 24. The channel region 24 is interposed between the source region 20 and the drain region 22.

Herein, the charge trapping layer 14 has a function to actively trap charges as memory cell information. At the time of performing writing/erasing on the memory cell, the tunnel insulating layer 12 functions as an electron/hole transfer pathway between the channel region 24 in the semiconductor layer 10 and the charge trapping layer 14 through a tunneling phenomenon. Further, at the time of reading/standby, the tunnel insulating layer 12 has a function to suppress electron/hole transfer between the channel region 24 and the charge trapping layer 14 due to its barrier height. Moreover, the block insulating layer 16 is a so-called interelectrode insulating film, and has a function to block the electron/hole flow between the charge trapping layer 14 and the control gate electrode 18.

Other than silicon, silicon germanide, germanium, a compound semiconductor, or the like can be used for the semiconductor layer 10.

The tunnel insulating layer 12 is, for example, a silicon oxide ($SiO_2$) film. The tunnel insulating layer 12 may be either a single-layer film or a multilayer film. The material for the tunnel insulating layer 12 is not restricted to silicon oxide exemplified above, but another type of an insulating layer can be applied if appropriate.

The charge trapping layer 14 is an organic molecular layer made up of organic molecules, and has a thickness of about 1 to 20 nm, for example. It is to be noted that from the viewpoint of scaling-down of the memory cell, the charge trapping layer 14 is desirably a organic molecular layer.

The block insulating layer 16 is a metal oxide film, e.g., hafnium oxide. Other than hafnium oxide ($HfO_2$) described above, aluminum oxide ($Al_2O_3$), for example, can be used for the block insulating layer 16.

The block insulating layer 16 may be either a single-layer or a multi-layer. The block insulating layer 16 is, for example, a metal oxide layer formed by ALD (Atomic Layer Deposition).

Further, the control gate electrode 18 is, for example, polycrystalline silicon introduced with impurities to impart conductivity. An arbitrary conductive material can be used for the control gate electrode 18. Other than polycrystalline silicon described above, for example, the amorphous silicon introduced with impurities to impart conductivity, or the like, can be used for the control gate electrode 18. Further, metal, an alloy, a metal semiconductor compound or the like may be used for the control gate electrode 18.

Moreover, the source region 20 and the drain region 22 are formed, for example, of p-type diffusion layers containing p-type impurities.

Figure 3:
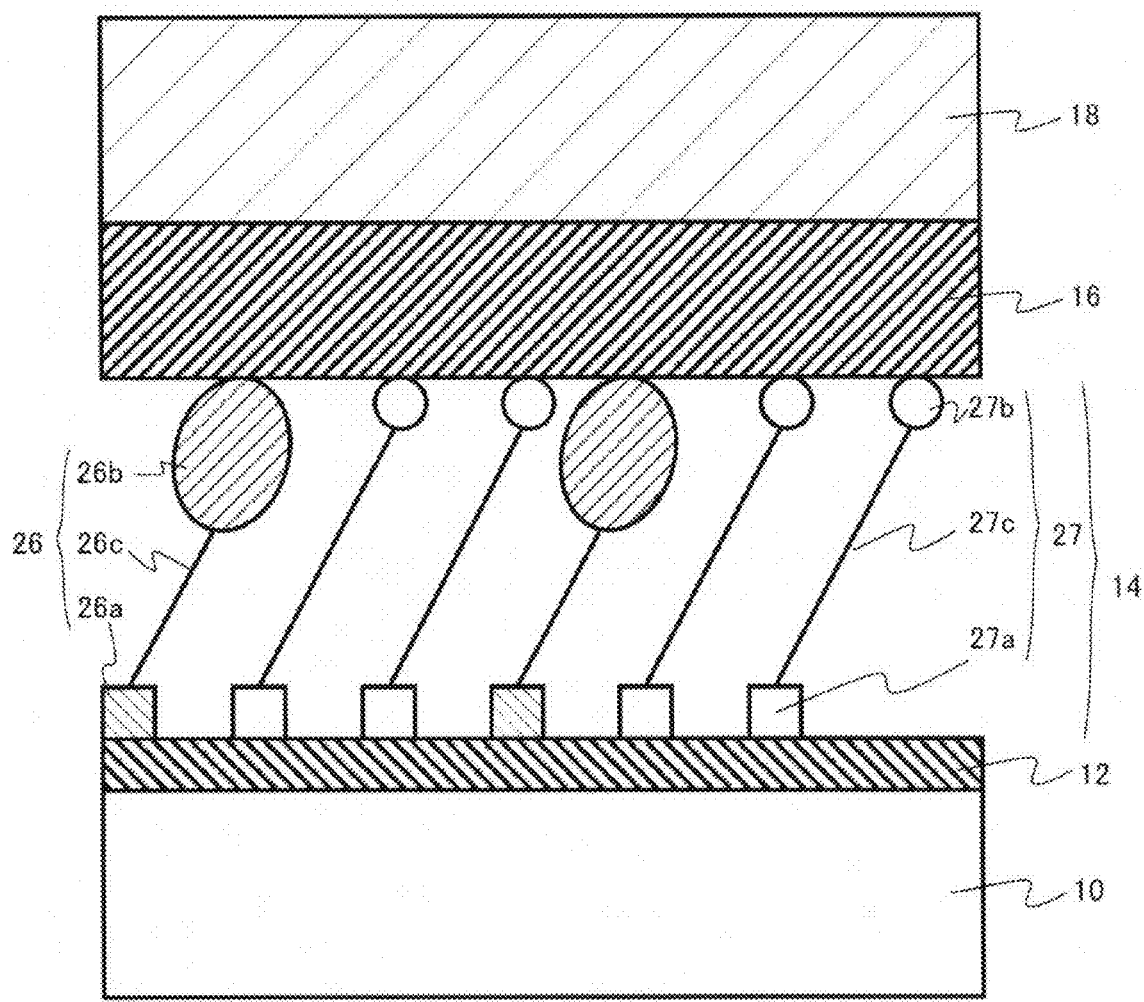
FIG. 3 is an enlarged schematic view of the memory cell unit of the nonvolatile semiconductor memory device according to the first embodiment.

FIG. 3 is an enlarged schematic view of the memory cell unit of the nonvolatile semiconductor memory device according to the present embodiment. It is a view showing a detail of the organic molecular layer 14.

The charge trapping layer 14 is made up of at least two or more of organic molecules. At least one out of the two or more is a charge trapping molecule (first organic molecule) 26, and the other one is a seed molecule (second organic molecule) 27.

The charge trapping molecule 26 has a function to store charges that are to be data of the memory cell. The seed molecule 27 has a function to be a reaction source in ALD and be thus chemically bonded to the block insulating layer 16 so as to improve insulation characteristics and data retention properties.

As shown in FIG. 3, the charge trapping molecule 26 is made up of a terminal group 26a that is chemically bonded to the tunnel insulating layer 12, a charge trapping unit 26b that traps charges, and a connecting unit 26c that connects between the terminal group 26a and the charge trapping unit 26b.

The charge trapping molecule 26 has the first alkyl chain or the first alkyl halide chain whose one end is bonded to the tunnel insulating layer 12, and the charge trapping unit 26b connected to the other end of the first alkyl chain or the first alkyl halide chain.

The terminal group 26a has a function to chemically adsorb the charge trapping molecule 26 onto the tunnel insulating layer 12 through a chemical bond (covalent bond, ionic bond, or metallic bond). Hence the charge trapping molecule 26 is arranged on the tunnel insulating layer 12 without being a multilayer. For this reason, the charge trapping molecules 26 become a single layer, to allow uniformity of the film thickness and scaling-down due to reduction in film thickness.

For the terminal group 26a, it is desirable to use a chemical reaction group which is generally used for the self-assembled monolayer (SAM). For example, one for the terminal group 26a is desirably selected from a silyl group, an alkoxysilyl group, an alkylsilyl group, a chlorosilyl group, a phosphoryl group, an alkyl selenide group, a telluride group, a sulfide group, a disulfide group, a thio group, an isocyanate group, an alkyl bromide group, a carbonyl group, an alkoxy group, alkane and alkene.

The charge trapping unit 26b has a function to trap charges by applying an electric fields. The charge trapping unit 26b preferably has a polycyclic structure. It is, for example, possible to apply macrocyclic molecules represented by porphyrin and phthalocyanine, and non-macrocyclic molecules such as metallocene, pentacene, anthracene, oligophenylenevinylene, thiophene, tetrathiafulvalene, tetracyanoquinodimethane, tetramethyltetraselenafulvalene, and fullerene. These molecules are not restrictive, but derivatives of those are also applicable.

The charge trapping unit 26b is preferably a porphyrin derivative, a phthalocyanine derivative, a chlorine derivative, a tetrapyrrole derivative, a bipyridine derivative, an indole derivative, an acene derivative, a quinoxaline derivative, a phenylenevinylene derivative, or a fullerene derivative.

The charge trapping unit 26b is desirably organic molecules having a polycyclic structure with a molecular weight of not smaller than 100 and not larger than 2000. When the molecular weight falls below 100, a sufficient development in π-conjugated system cannot be obtained, and stable exchanges of charges (redox reactions) become difficult. When the molecular weight exceeds 2000, the thickness as the charge trapping layer increases, and responding to a request for scaling-down becomes difficult.

FIGS. 4A to 4D are diagrams each exemplifying a molecular structure of the charge trapping unit. Those are examples of porphyrin, the porphyrin derivative, phthalocyanine, and the phthalocyanine derivative which are preferable for the charge trapping unit 26b.

Examples of R1 to R3 and R of FIGS. 4A to 4D include hydrogen, an alkyl group, a fluoroalkyl group, an alkoxy group, an aryl group, a halogen group, an amino group, a nitro group, a phenyl group, a cycloalkyl group, a carboxyl group, an amide group, an imide group, a cyano group, a thiol group, and a fluorophenyl group, provided that at least one is bonded to the connecting unit 26c. In that case, a structure such as an ether bond (—O—) or an amino bond (—NH—), in addition to a C—C bond, might be provided between the charge trapping unit 26b and the connecting unit 26c.

When a central metal (ME) is contained as in FIG. 4B, charge exchange with an electron orbit of the metal may occur. A metal element in this case is selected, for example, from Zn (zinc), Ti (titanium), Cu (copper), Ir (iridium), Ru (lutetium), Ni (nickel), Co (cobalt), Li (lithium), Mn (manganese), and Mg (magnesium). Further, when a n-conjugated system is formable, a macrocyclic molecular structure containing hetero atoms, as those shown in FIGS. 4B and 4D, is preferable.

The connecting unit 26c plays a function to connect the terminal group 26a and the charge trapping unit 26b. The connecting unit 26c simultaneously also plays an important role relating to a molecular orientation due to intermolecular forces between the charge trapping molecules 26 or between the charge trapping molecule 26 and the seed molecule 27. That is, it has a function to densely adsorb the charge trapping molecule 26 and the seed molecule 27 through the molecular orientation.

In order to have the function, the connecting unit 26c preferably has a straight chain molecular structure, and the connecting unit 26c is the alkyl chain (first alkyl chain) or the alkyl halide chain (first alkyl halide chain). The alkyl halide chain refers to an alkyl chain with a part or all of its hydrogen atoms substituted with halogen. Examples thereof include an alkyl chain and a fluoroalkyl chain represented by Formulas (A1) and (B1) below.

[Formula (A1)]

[Formula (B1)]

Herein, R represents the terminal group 26a and the charge trapping unit 26b. Further, m is an integer not smaller than 1 and not larger than 20.

As the number of m becomes larger, the intermolecular force becomes larger, and the ease of molecular orientation varies. However, when the connecting unit 26c is excessively long, the film thickness of the charge trapping layer increases, thus making it impossible to respond to the requirement for scaling-down. Further, when the connecting unit 26c is excessively long, it is highly difficult to form a dense organic layer.

Accordingly, m is preferably not smaller than 1 and not larger than 20. That is, the carbon number of the alkyl chain (first alkyl chain) or the alkyl halide chain (first alkyl halide chain) of the connecting unit 26c is desirably not smaller than 1 and not larger than 20.

The charge trapping molecule (first organic molecule) 26 is desirably an organic molecule represented by General Formula (1) below.

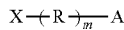

[General Formula (1)]

In General Formula (1), X is the terminal group 26a, which is a substituent group selected from a silyl group, an alkoxysilyl group, an alkylsilyl group, a chlorosilyl group, a phosphoryl group, an alkyl selenide group, a telluride group, a sulfide group, a disulfide group, a thio group, an isocyanate group, an alkyl bromide group, a carbonyl group, an alkoxy group, alkane and alkene. R is the connecting unit 26c, and represents the alkyl chain or the alkyl halide chain. A is the charge trapping unit 26b, and represents a substituent group having a polycyclic structure with a molecular weight of not smaller than 100 and not larger than 2000. m represents a positive integer not smaller than 1 and not larger than 20. It is to be noted that the substituent group A is further desirably a porphyrin derivative, a phthalocyanine derivative, a chlorine derivative, a tetrapyrrole derivative, a bipyridine derivative, an indole derivative, an acene derivative, a quinoxaline derivative, or a fullerene derivative.

As shown in FIG. 3, the seed molecule 27 is made up of a terminal group 27a chemically bonded to the tunnel insulating layer 12, a head unit 27b located at the end on the opposite side to the terminal group 27a in the seed molecule 27, and a connecting unit 27c that connects the terminal group 27a and the head unit 27b.

The seed molecule 27 has the second alkyl chain or the second alkyl halide chain whose one end is bonded to the tunnel insulating layer 12. And the seed molecule 27 has the head unit 27b being a functional group to serve as a reaction source in ALD at the other end of the second alkyl chain or the second alkyl halide chain.

Similarly to the terminal group 26a of the charge trapping molecule 26, the terminal group 27a of the seed molecule 27 has a function to chemically adsorb the seed molecule 27 onto the tunnel insulating layer 12 through a chemical bond (covalent bond, ionic bond, or metallic bond). Hence it is desirable to select the terminal group 27a from those exemplified as the terminal group 26a of the charge trapping molecule 26. The terminal group 27a and the terminal group 26a may be the same or different.

The head unit 27b is the functional group to serve as the reaction source in ALD. The head unit 27b is desirably a hydroxy group (—OH), a carboxyl group (—COOH), or some other acid group. Since many of the head units 27b are chemically bonded to the block insulating layer 16, the head unit 27b may be an ether group (—O—) or an ester group (—COO—).

The connecting unit 27c plays a function to connect the terminal group 27a and the head unit 27b. As in the foregoing case of the charge trapping molecule 26, the connecting unit 27c also plays an important role relating to a molecular orientation due to intermolecular forces between the seed molecules 27 or between the charge trapping molecule 26 and the seed molecule 27.

That is, it has a function to densely adsorb the charge trapping molecule 26 and the seed molecule 27 through the molecular orientation. In order to have the function, the connecting unit 27c preferably has a straight chain molecular structure, and the connecting unit 27c is the alkyl chain (second alkyl chain) or the alkyl halide chain (second alkyl halide chain). Examples thereof include an alkyl chain and a fluoroalkyl chain represented by Formulas (A2) and (B2) below.

[Formula (A2)]

[Formula (B2)]

Herein, R represents the terminal group 27a and the head unit 27b. Further, n is an integer not smaller than 3 and not larger than 30.

The number of n is preferably not smaller than 3 and not larger than 30. When the number of n is excessively small, the reactivity of the functional group of the head unit 27b may be significantly changed to be degraded due to the influence of the terminal group 27a. An increase in the number of n allows intensification of intermolecular forces, changing the easiness of the molecure orientation. However, when the connecting unit 27c is excessively long, the thickness as the charge trapping layer increases, thus making it impossible to respond to the requirement for scaling-down. Further, when the connecting unit 27c is excessively long, it is highly difficult to form a dense organic layer. That is, the carbon number of the alkyl chain (second alkyl chain) or the alkyl halide chain (second alkyl halide chain) of the connecting unit 27c is desirably not smaller than 3 and not larger than 30.

The seed molecule (second organic molecule) 27 is desirably an organic molecule represented by General Formula (2) below.

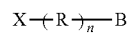

[General Formula (2)]

In General Formula (2), X is the terminal group 27a, which is a substituent group selected from a silyl group, an alkoxysilyl group, an alkylsilyl group, a chlorosilyl group, a phosphoryl group, an alkyl selenide group, a telluride group, a sulfide group, a disulfide group, a thio group, an isocyanate group, an alkyl bromide group, a carbonyl group, an alkoxy group, alkane and alkene. R is the connecting unit 27c, and represents the alkyl chain or the alkyl halide chain. B is a head unit 27b, which is a substituent group selected from a hydroxy group, an ether group, a carboxyl group and an ester group. The number of functional groups contained in B is not restricted to one, and may be two or larger. n is an integer not smaller than 3 and not larger than 30.

The seed molecules 27 are desirably designed as molecules having a steric hindrance smaller than that of the charge trapping molecule 26, and having strong intermolecular forces. For this reason, a straight chain structure such as an alkyl chain and an alkyl halide chain is desirable. Accordingly, at the time of forming the organic molecular layer 14, it is possible to suppress a decrease in adsorption amount of the charge trapping molecules 26 due to adsorption of the seed molecules.

Figure 5:
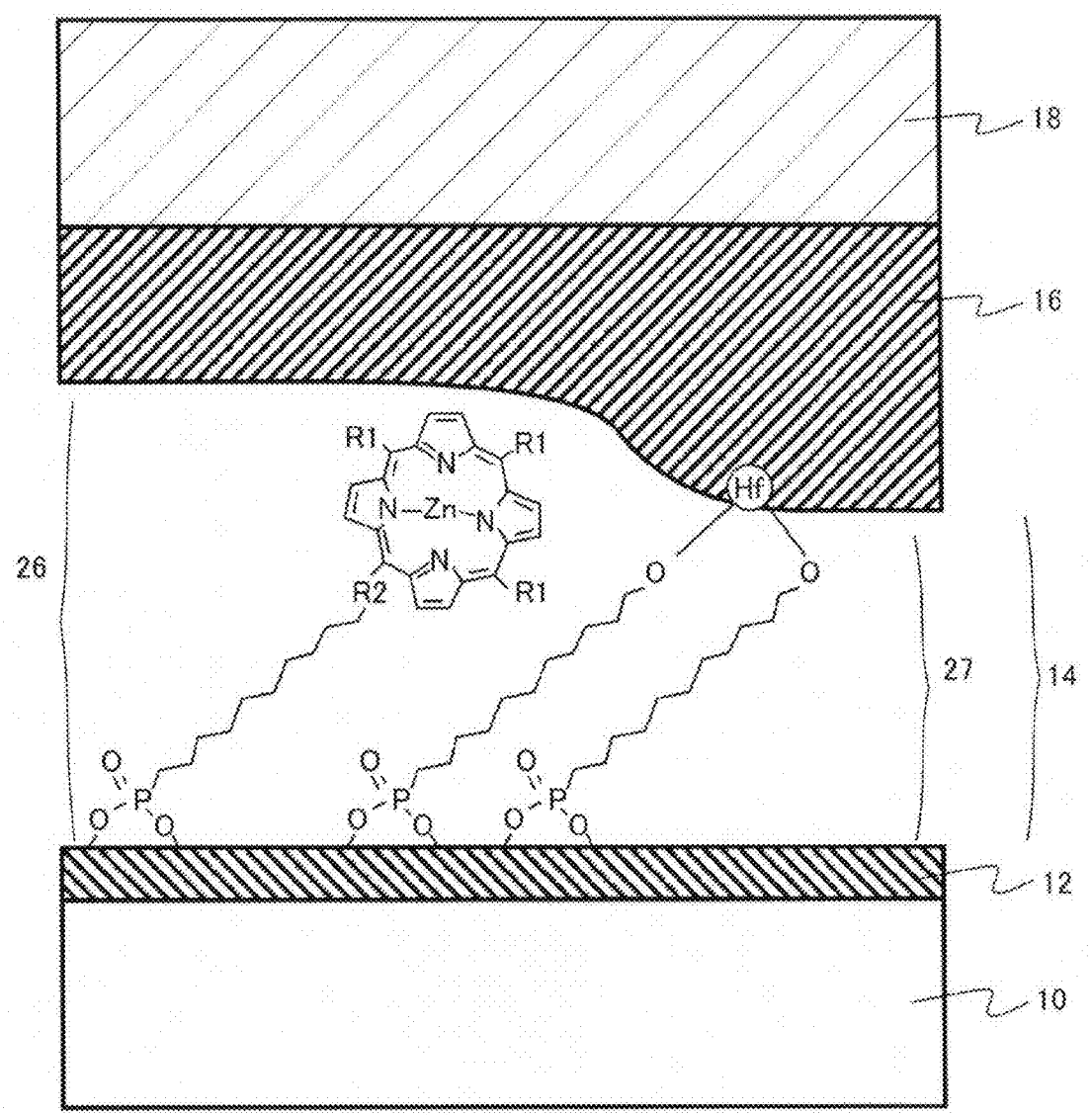
FIG. 5 is a diagram exemplifying organic molecules constituting an organic molecular layer according to the first embodiment.

FIG. 5 is a diagram exemplifying organic molecules constituting an organic molecular layer according to the present embodiment. The case where hafnium oxide is used as the block insulating layer 16 is exemplified here.

In the charge trapping molecule (first organic molecule) 26, the terminal group 26a is a phosphoryl group, the charge trapping unit 26b is porphyrin, and the connecting unit 26c is the alkyl chain (first alkyl chain). In the seedmolecule (second organic molecule) 27, the terminal group 27a is a phosphoryl group, the head unit 27b is an ether group (—O—), and the connecting unit 27c is the alkyl chain (second alkyl chain).

The ether group of the head unit 27b of the seed molecule (second organic molecule) 27 is bonded with hafnium (Hf) atoms of the block insulating layer 16.

The first organic molecule 26 and the second organic molecule 27 can be detected by the following analysis methods. That is, the first organic molecule 26 and the second organic molecule 27 can be detected using a mass spectroscopy (MS), a secondary ionic mass spectrometry (SIMS), a nuclear magnetic resonance (NMR), an elemental analysis, an infrared reflection absorption spectroscopy (IR-RAS), an X-ray fluorescence analysis (XRF), an X-ray photoelectron spectroscopy (XPS), an ultraviolet-visible spectrophotometry (UV-vis), a spectrofluorometry (FL), or the like.

When an insulating layer of metal oxide or the like is formed on the organic molecular layer 14, the analysis is performed while scraping its surface, for example, with a sputter using argon ions, or the like. Alternatively, the organic molecular layer 14 is dissolved and peeled by a hydrofluoric acid aqueous solution or the like, simultaneously with the insulating layer of the metal oxide or the like, to analyze the solution.

Further, in the method for performing the analysis by scraping the surface by means of the above sputter or the like, heating process may be performed as the scraping method. In this case, a gas containing the scraped material may be adsorbed to another material such as an activated carbon, and another material such as the activated carbon adsorbed with the gas may be analyzed and detected. Further, in the method for peeling the material by the hydrofluoric acid aqueous solution or the like and analyzing the solution, the dissolved and peeled material may be subjected to a reduced pressure or a thermal treatment to be concentrated, and may then be analyzed and detected.

At the time of a writing operation of the memory cell according to the present embodiment, a voltage is applied between the control gate electrode 18 and the semiconductor layer 10 such that the control gate electrode 18 is at a relatively negative voltage, to trap positive charges into the charge trapping layer 14. When the control gate electrode 18 is at relatively negative voltage, an inversion layer is formed in the channel region 24 and holes are accumulated thereinto. The holes move in the tunnel insulating layer 12, and are trapped by the charge trapping molecules of the charge trapping layer 14.

In this state, a threshold of the transistor of the memory cell is high as compared with the state of the holes not being stored. That is, this is a state where the transistor is not likely to be turned on. This state is a state where data "0" has been written.

At the time of performing a data erasing operation, a voltage is applied between the control gate electrode 18 and the semiconductor layer 10 such that the control gate electrode 18 is at a relatively positive voltage. Due to an electric field between the control gate electrode 18 and the semiconductor layer 10, the holes stored in the charge trapping layer 14 are transferred in the tunnel insulating layer 12 and are drawn to the semiconductor layer 10.

In this state, a threshold of a transistor of the memory cell is low as compared with that in the state of data "0". That is, this is a state where the transistor is likely to be turned on. This state is a state of data "1".

At the time of reading data, a voltage is applied between the source region 20 and the drain region 22. For example, in the state of data "0" where the holes are stored, the threshold of the transistor is high, and hence the inversion layer is not formed in the channel region 24, and a current does not flow between the source and the drain.

On the other hand, in the erased state, namely in the state of data "1", the threshold of the transistor is low, and hence the inversion layer is formed in the channel region 24, and a current flows between the source and the drain. As thus described, sensing a current amount of the transistor makes it possible to read whether data is data "0" or data "1".

It should be noted that at the time of performing a data verifying operation after performing the data writing operation to check whether the writing has been sufficiently performed, an operation similar to one at the time of the reading operation is performed. When a voltage is applied between the source region 20 and the drain region 22, and a desired current does not flow, the data writing operation is performed again.

As thus described, the writing, erasing and reading operations are performed on the memory cell of the present embodiment, to function as the nonvolatile semiconductor memory device.

Next, advantageous effects of the nonvolatile semiconductor memory device according to the present embodiment will be described.

The charge trapping molecules 26 and the seed molecules 27 are respectively chemically bonded onto the tunnel insulating layer 12, to be chemically adsorbed thereto, thus forming the uniform organic molecular layer 14.

As thus described, the charge trapping molecule 26 plays a function to trap charges injected from the channel region 24 through the tunnel insulating layer 12. On the other hand, the seed molecule 27 serves as the formation source or seed for the block insulating layer 16, and is chemically bonded to the block insulating layer 16, thereby to play a function to improve the film quality of the block insulating layer 16 and the adhesiveness with the charge trapping layer 14.

In general, the organic molecule is vulnerable to heat as compared with inorganic oxide and the like. For this reason, as a method for depositing an oxide on the organic molecular layer 14 in which deposition can be performed at a temperature as low as possible is often selected. For example, the block insulating layer 16 is formed by a method referred to as Atomic Layer Deposition (ALD). Hereinafter, a reaction process at the time of forming a metal oxide film by thermal ALD will be briefly described.

First, a treatment to extract a hydroxyl group on the surface where a metal oxide film is wished to be formed is performed. When an organometallic molecules referred to as a precursor are introduced to this surface in an inert gas, the hydroxyl group on the surface is reacted and bonded with the precursor. When an oxidant is introduced to the surface after purging of the unreacted precursor, the bonded and immobilized precursor surface is reacted with the oxidant, to form a metal oxide layer. When the unreacted oxidant is purged, a new hydroxyl group surface is formed on the re-surface.

In each reaction process, since the reactivion sources exist only on the surface, the reactions with the precursor and the oxidant do not proceed when the reactivion source is depleted. For this reason, a film thickness to increase in each process is determined. Accordingly, the oxide film thickness can be controlled by performing the alternative reaction process for a desired number of times.

In principle, ALD film formation does not proceed when not reacted with the hydroxyl group on the surface. However, in practice, the film formation is started, for example, by first introducing an oxidant (e.g., $H_2O$) to the surface and physically adsorbing it thereto.

Assuming that the surface where only the charge trapping molecules 26 are densely adsorbed onto the tunnel insulating layer 12 is used, the surface of the charge trapping molecule 26 has hydrophobic (lipophilic) properties and is resistant to occurrence of physical adsorption of the oxidant, and is thus resistant to formation of the block insulating layer 16.

Since thebacke a large number of reaction sites existing on the surface in fact, it is not the case that the block insulating layer 16 is not formed at all, but the quantity of interface between block insulating layer and charge trapping layer is degraded. Further, the wettability of the interface between the charge trapping layer 14 and the block insulating layer 16 has degraded, and film peeling from this interface, or the like, thus tends to occur.

Therefore, when the seed molecule 27 is inserted into the charge trapping layer 14 as in the present embodiment, the head unit 27b of the seed molecule 27 comes to serve as the reactivion source or reactive seed of ALD. This promotes formation of the block insulating layer 26, and suppresses degradation in film quality of the block insulating layer 26. Hence the insulation properties of the block insulating layer 26 improve.

This leads to an improvement in insulation properties between the organic molecular layer 14 and the control gate electrode as compared with the case without the seed molecules 27. This suppresses leakage of charges from the charge trapping layer 14 to the control gate electrode 18, thereby to realize the nonvolatile semiconductor device excellent in charge retention properties.

Further, the insulating properties of the block insulating layer 26 improves, providing the nonvolatile semiconductor device excellent in charge retention properties.

Moreover, bonding the seed molecules 27 to atoms in the block insulating layer 16 leads to improvement in interface adhesiveness between the organic molecular layer 14 and the block insulating layer 16. From this viewpoint, the reliability of nonvolatile semiconductor device become excellent.

Further, since the insulating properties of the block insulating layer 26 improves, the block insulating layer 26 can be reduced in thickness. Hence it is possible to realize the nonvolatile semiconductor device provided with the fine memory cell.

Next, a method for manufacturing the nonvolatile semiconductor memory device according to the present embodiment will be described.

The method for manufacturing the nonvolatile semiconductor device according to the present embodiment includes: forming the tunnel insulating layer 12 on the semiconductor layer 10; forming the organic molecular layer 14 on the tunnel insulating layer 12 by self-assembling, the organic molecular layer 14 containing the first organic molecules 26 and the second organic molecules 27, the first organic molecule 26 having the first alkyl chain or the first alkyl halide chain and the charge trapping unit, the second organic molecule 27 having the second alkyl chain or the second alkyl halide chain and a hydroxy group, an ether group, a carboxyl group or an ester group; forming the block insulating layer 16 on the organic molecular layer 14 by ALD; and forming the control gate electrode 18 on the block insulating layer 16.

For example, the tunnel insulating layer 12 is formed on the semiconductor layer 10 of monocrystalline silicon. When the tunnel insulating layer 12 is silicon oxide, it can be formed, for example, by introducing a silicon substrate into a thermal oxidization furnace for forcible oxidation.

Further, tunnel insulating layer 12 is also possible to form it by means of ALD or a film forming device such as a sputter. In the case of film forming, it is desirable to anneal the insulating film after the film formation, by means of a Rapid Thermal Annealing (RTA) device.

Then, the charge trapping layer (organic molecular layer) 14 is formed on the tunnel insulating layer 12.

In the case of forming the charge trapping layer 14, for example, the following methods are applicable. The methods can be included where the charge trapping molecules 26 and the seed molecules 27 are simultaneously formed on the tunnel insulating layer 12, and where the charge trapping molecules 26 are formed on the tunnel insulating layer 12 and the seed molecules 27 are formed on the tunnel insulating layer 12 in separate processes.

In the following, a description will be made by taking as an example the case where the charge trapping molecules 26 and the seed molecules 27 are simultaneously formed on the tunnel insulating layer 12.

The surface of the tunnel insulating layer 12 to be a foundation where the charge trapping layer 14 is formed is cleaned. In this cleaning process, wet cleaning that used a mixed solution of sulfuric acid and hydrogen peroxide (a mixed ratio is 2:1, for example), or UV dry cleaning are adopted.

Next prepared are the charge trapping molecules 26 containing the charge trapping unit 26b, the connecting unit 26c for the alkyl chain or the alkyl halide chain, and the terminal group 26a. Further prepared are the seed molecules 27 containing the head unit 27b, the connecting unit 27c for the alkyl chain or the alkyl halide chain, and the terminal group 27a. The cleaned surface of the tunnel insulating layer 12 is soaked in a solution obtained by dissolving these two molecules. The terminal groups 26a and 27a are then brought into reaction with the surface of the tunnel insulating layer 12.

As the solvent, it is considered to use one in which the two organic molecules can be well dissolved, including organic solvents such as acetone, toluene, ethanol, methanol, hexane, cyclohexanone, isopropyl alcohol, or propylene glycol monomethylether acetate (PEGMA). In some cases, the charge trapping molecules 26 and the seed molecules 27 can be dissolved in water, and in such cases, water can be used as the solvent. Further, a mixed solvent of those can also be used as the solvent.

When the concentration of the charge trapping molecules 26 to be dissolved in the solvent is excessively low, the reaction time is long, and when it is excessively high, unnecessary adsorption molecules that need to be removed by a rinsing operation increase. Hence the concentration is desirably set to be an appropriate one. For example, the concentration is desirably set to about 0.1 to 100 mM.

Also, when the concentration of the seed molecules 27 is excessively low, the reaction time is long, and when it is excessively high, unnecessary adsorption molecules that need to be removed by the rinsing operation increase. Hence the concentration is desirably set to be an appropriate one. For example, the concentration is desirably set to about 0.1 to 100 mM.

The function of the charge trapping layer 14 can be controlled by a mixing ratio of the charge trapping molecules 26 and the seed molecules 27. When an amount of the charge trapping molecules 26 is small, a stored charge amount decreases. A mole fraction of the seed molecules 27 to the charge trapping molecules 26 is preferably not larger than 50% on an empirical basis, and further preferably not larger than 10%.

The time for soaking the surface of the insulating layer in the solution of the charge trapping molecules 26 and the second organic molecules 27 is desirably enough for occurrence of sufficient reaction, and specifically, it is desirable to wait for not shorter than one minute.

The surface is then soaked in the used solvent, and rinsed using an ultrasonic cleaner. In order to rinse the unnecessarily physically adsorbed organic material, this operation is desirably performed at least twice or more, as the solvent is replaced by a new one.

Subsequently, the surface is soaked in ethanol, and rinsed using the ultrasonic cleaner in a similar manner to the above.

The solvent is then removed by a nitride air gun, a spin coater or the like, and drying is then performed. This leads to formation of the charge trapping layer 14 made up of the charge trapping molecules 26 and the seed molecules 27 on the tunnel insulating layer 12.

Thereafter, for example, a hafnium oxide film is deposited on the charge trapping layer (organic molecular layer) 14, to form the block insulating layer 16.

The block insulating layer 16 can be formed by ALD. A desirable formation method is one where the organic molecular layer 14 formed of the organic molecules is not degraded and decrease the damage, and for example, thermal ALD is a desirable one. When the insulating layer after the layer formation is annealed using the RTA device, an atomic density in the film increases, which is desirable.

An impurity-doped polycrystalline silicon layer is then formed by CVD (Chemical Vapor Deposition), for example, to form the control gate electrode 18. The stacked layers are then patterned, thereby to form a gate electrode structure.

Subsequently, for example, p-type impurities are ion-planted using the control gate electrode 18 as a mask, to form the source region 20 and the drain region 22. In such a manner, it is possible to manufacture the nonvolatile semiconductor memory device shown in FIG. 1.

As described above, according to the present embodiment, using the charge trapping molecules 26 and the seed molecules 27 for the charge trapping layer 14 allows realization of the nonvolatile semiconductor memory device excellent in charge retention properties and reliability.

Second Embodiment

A nonvolatile semiconductor memory device according to the present embodiment differs from that of the first embodiment in that the tunnel insulating layer is not provided and the organic molecular layer has a function of the tunnel insulating layer. It also differs from the first embodiment in that the first alkyl chain or the first alkyl halide chain and the second alkyl chain or the second alkyl halide chain are bonded to the semiconductor layer and the carbon number of the first alkyl chain or the first alkyl halide chain is not smaller than 6 and not larger than 30. Hereinafter, descriptions of contents that overlap with those of the first embodiment will be omitted.

Figure 6:
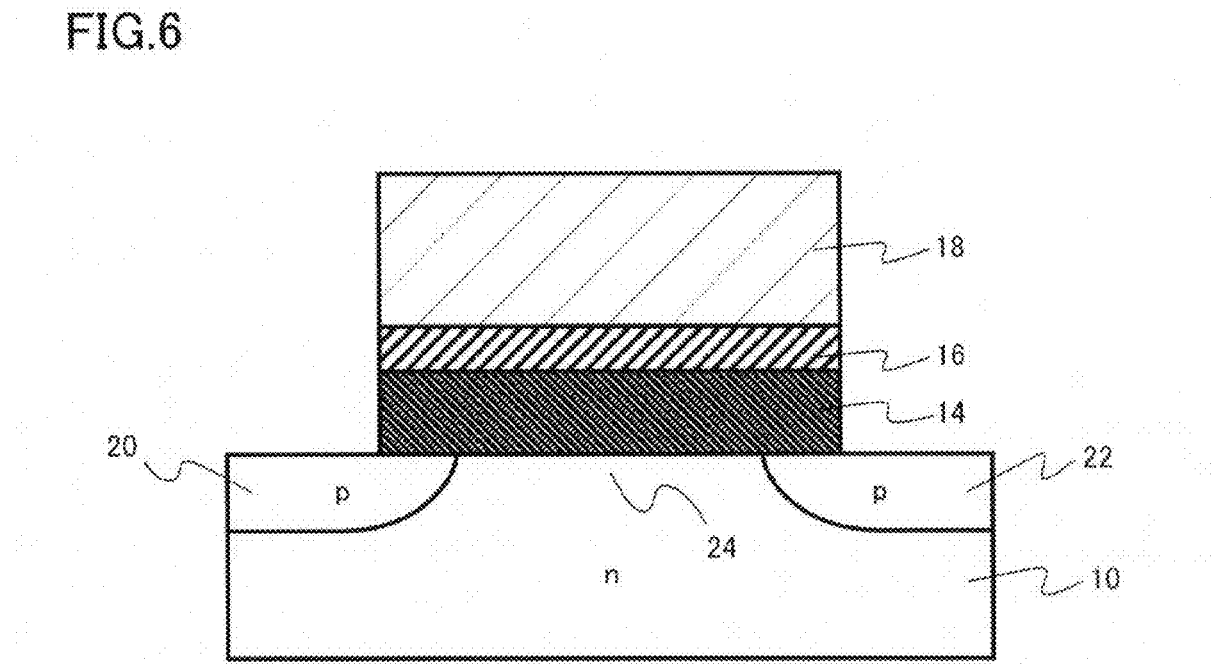
FIG. 6 is a sectional view of a memory cell unit of a nonvolatile semiconductor memory device according to a second embodiment.

FIG. 6 is a sectional view of a memory cell unit of the nonvolatile semiconductor memory device according to the present embodiment.

The memory cell is formed, for example, on the n-type silicon semiconductor layer 10 containing n-type impurities. The organic molecular layer 14 is provided on the semiconductor layer 10, the block insulating layer 16 is provided on the organic molecular layer 14, and the control gate electrode 18 is provided on the block insulating layer 16. The source region 20 and the drain region 22 are formed in the semiconductor layer 10 on both sides of the control gate electrode 18. A region below the control gate electrode 18 in the semiconductor layer 10 is the channel region 24. The channel region 24 is interposed between the source region 20 and the drain region 22.

The organic molecular layer 14 also has the function of the tunnel insulating layer due to the first organic molecule 26 in the organic molecular layer 14.

In the present embodiment, the first organic molecules 26 and the second organic molecules 27 are chemically bonded directly to the semiconductor layer 10. Then, the organic molecular layer 14 is a self-assembled monolayer on the semiconductor layer 10.

As in the first embodiment, the first organic molecule 26 has a function to trap charges that are to be data of the memory cell. As shown in FIG. 3, the first organic molecule 26 is made up of the terminal group (modified group) 26a that is chemically bonded to the tunnel insulating layer 12, the charge trapping unit 26b that stores charges, and the connecting unit 26c that connects the terminal group 26a and the charge trapping unit 26b.

Then, the first organic molecule 26 is provided with an insulating unit between the charge trapping unit 26b and the semiconductor layer 10. Herein, the connecting unit 26c corresponds to the insulating unit. The connecting unit 26c is the alkyl chain or the alkyl halide chain with a carbon number being not smaller than 6 and not larger than 30. The function as the tunnel insulating layer is exerted by this alkyl chain or alkyl halide chain.

The carbon number of this alkyl chain or alkyl halide chain is not smaller than 6 and not larger than 30, and desirably not smaller than 10 and not larger than 20. This is because, when the carbon number is below the above range, the insulating resistance might deteriorate and the self-assembled monolayer might be difficult to form. Further, when the carbon number exceeds the above range, the film thickness might be large, rendering the scaling-down being difficult.

The method for manufacturing the nonvolatile semiconductor device according to the present embodiment includes: forming the organic molecular layer 14 as a monolayer film on the semiconductor layer 10 by self-assembling, the organic molecular layer 14 containing the first organic molecules 26 and the second organic molecules 27, the first organic molecule 26 having the first alkyl chain or the first alkyl halide chain and the charge trapping unit, the second organic molecule 27 having the second alkyl chain or the second alkyl halide chain and a hydroxy group, an ether group, a carboxyl group or an ester group; forming the block insulating layer 16 on the organic molecular layer 14 by ALD; and forming the control gate electrode 18 on the block insulating layer 16.

For example, the organic molecular layer 14 is formed on the semiconductor layer (semiconductor substrate) 10 of monocrystalline silicon. First, the first organic molecules 26 and the second organic molecules 27 are simultaneously or separately supplied to form the layer on the organic molecular layer 14 by self-assembling.

The above is similar to that in the first embodiment except that the organic molecular layer 14 is formed directly on the semiconductor layer 10.

According to the above embodiment, in place of the tunnel insulating layer of an inorganic material such as an oxide, the organic molecular layer 14 realizes the function of the tunnel insulating layer. Therefore, the physical film thickness of the memory cell structure can be small. Hence it is possible to realize the nonvolatile semiconductor device provided with the fine memory cell.

Further, eliminating the need for formation of the tunnel insulating layer of the inorganic material can realize simplification of the manufacturing process.

Third Embodiment

The nonvolatile semiconductor memory device according to the present embodiment is similar to that in the first embodiment except that the conductive layer is formed between the tunnel insulating layer and the organic molecular layer, and that the conductive layer is bonded with the first alkyl chain or the first alkyl halide chain and the second alkyl chain or the second alkyl halide chain. Hereinafter, descriptions of contents that overlap with those of the first embodiment will be omitted.

Figure 7:
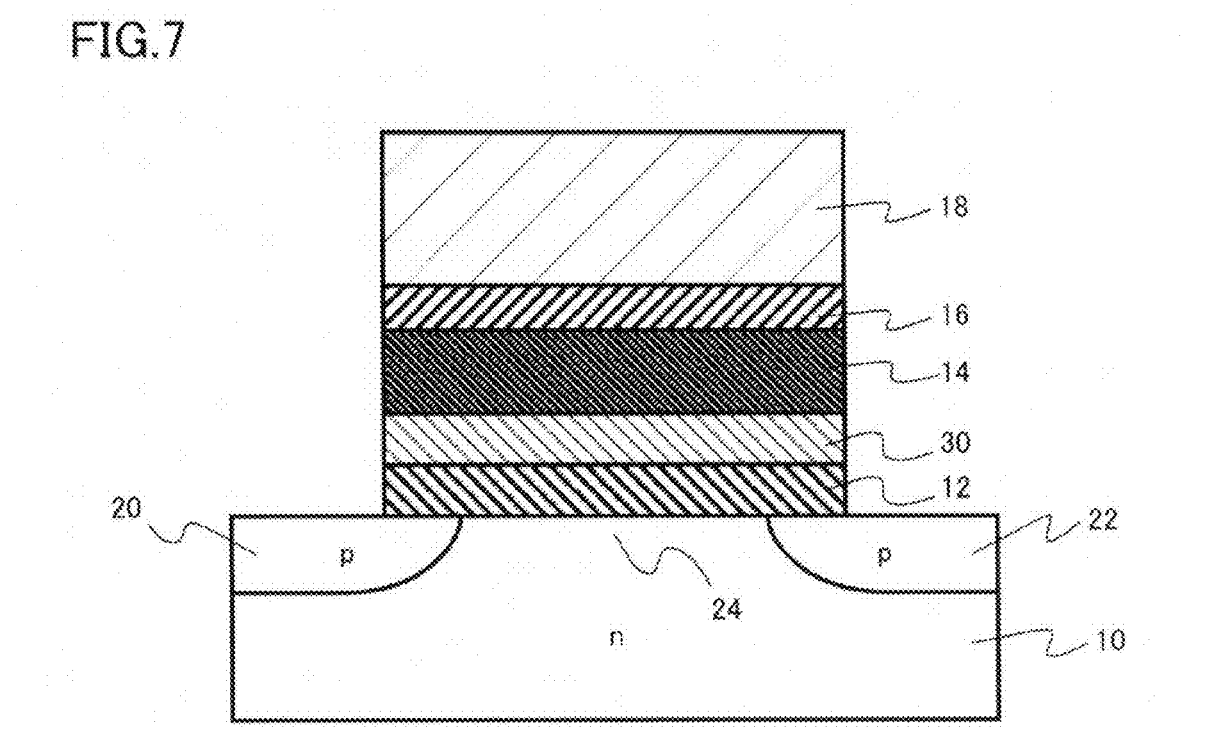
FIG. 7 is a sectional view of a memory cell unit of a nonvolatile semiconductor memory device according to a third embodiment.

FIG. 7 is a sectional view of a memory cell unit of the nonvolatile semiconductor memory device according to the present embodiment.

The memory cell is formed, for example, on the n-type silicon semiconductor layer 10 containing n-type impurities. The tunnel insulating layer 12 is provided on the silicon semiconductor layer 10, a conductive layer 30 is provided on the tunnel insulating layer 12, the organic molecular layer 14 is provided on the conductive layer 30, the block insulating layer 16 is provided on the organic molecular layer 14, and the control gate electrode 18 is provided on the block insulating layer 16. The source region 20 and the drain region 22 are formed in the semiconductor layer 10 on both sides of the control gate electrode 18. A region below the control gate electrode 18 in the semiconductor layer 10 is the channel region 24. The channel region 24 is interposed between the source region 20 and the drain region 22.

The conductive layer 30 has a function to uniformly disperse charges stored in the organic molecular layer 14. Accordingly, a concentration distribution of constant charges without variations is given inside the organic molecular layer 14, to realize a stable operation. Further, the conductive layer 30 has a function to read charges stored in the organic molecular layer 14 so as to improve writing efficiency.

The conductive layer 30 is, for example, a semiconductor film, a metal film, or a metal compound film. For example, it is possible to use polycrystalline silicon or amorphous silicon introduced with impurities to impart conductivity.

In the case of the present embodiment, the first organic molecules 26 and the second organic molecules 27 are bonded onto the conductive layer 30 by self-assembling. In this case, when the conductive layer 30 is silicon, each of the terminal groups 26a and 27a of the first organic molecule 26 and the second organic molecule 27 is desirably a thiol group from the viewpoint of facilitating the bonding.

The method for manufacturing the nonvolatile semiconductor device according to the present embodiment includes: forming the tunnel insulating layer 12 on the semiconductor layer 10; forming the conductive layer 30 on the tunnel insulating layer 12; forming the organic molecular layer 14 as a monolayer on the conductive layer 30 by self-assembling, the organic molecular layer 14 containing the first organic molecules 26 and the second organic molecules 27, the first organic molecule 26 having the first alkyl chain or the first alkyl halide chain and the charge trapping unit 26b, the second organic molecule 27 having the second alkyl chain or the second alkyl halide chain and a hydroxy group, an ether group, a carboxyl group or an ester group; forming the block insulating layer 16 on the organic molecular layer 14 by ALD; and forming the control gate electrode 18 on the block insulating layer 16.

The conductive layer 30 is formed on the tunnel insulating layer 12 for example, by CVD, ALD, sputtering, or the like. The organic molecular layer 14 is then formed on the conductive layer 30.

The above is similar to that in the first embodiment except that the tunnel insulating layer 12 is formed on the semiconductor layer 10 and the organic molecular layer 14 is formed on the conductive layer 30.

According to the present embodiment, it is possible to realize a nonvolatile semiconductor memory device whose operation is stable and which has excellent reading and writing characteristics.

Fourth Embodiment

A nonvolatile semiconductor memory device according to an embodiment includes: a semiconductor layer; a control gate electrode; and an organic molecular layer, which is formed between the semiconductor layer and the control gate electrode, and contains first organic molecules and second organic molecules, and in which the first organic molecule has a first alkyl chain or a first alkyl halide chain on the semiconductor layer side and a charge trapping unit on the control gate electrode side, and the second organic molecule has a second alkyl chain or a second alkyl halide chain on the semiconductor layer side and a hydroxy group, an ether group, a carboxyl group or an ester group on the control gate electrode side. A nonvolatile semiconductor memory device according to the present embodiment differs from that of the second embodiment in that the block insulating layer is not provided and the organic molecular layer has a function of the block insulating layer. Hereinafter, descriptions of contents that overlap with those of the second embodiment will be omitted.

Figure 8:
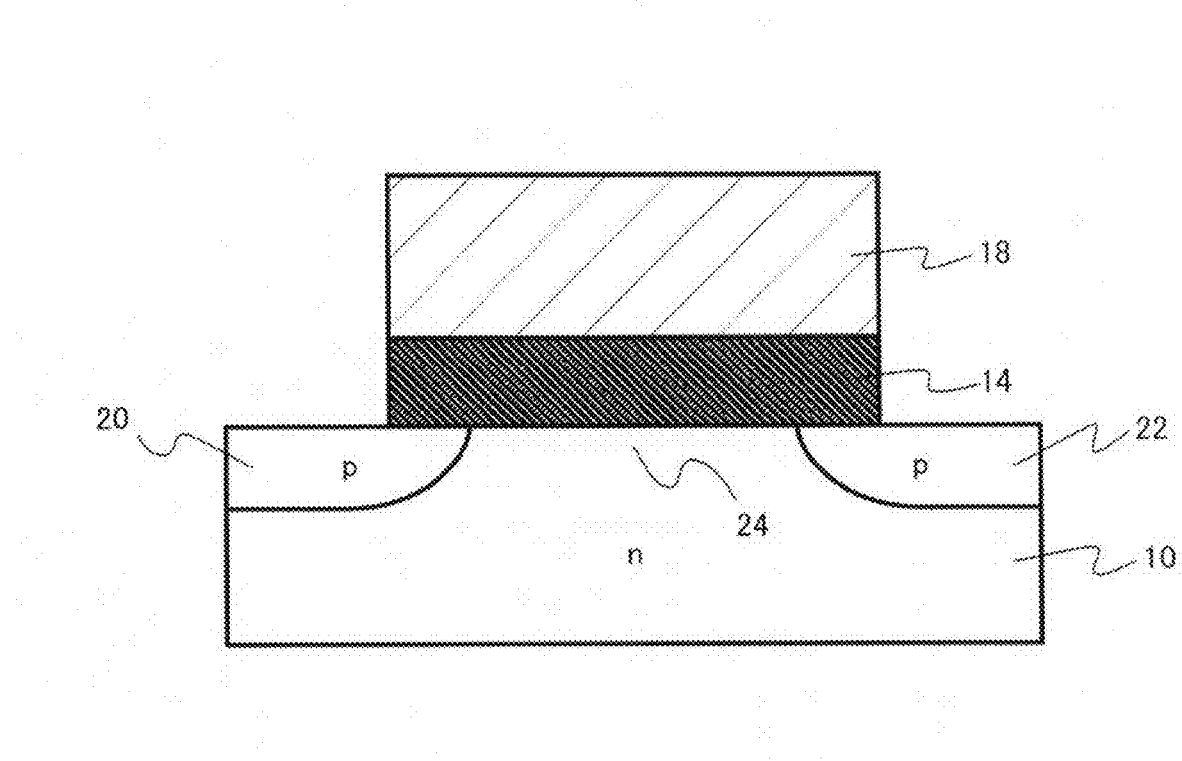
FIG. 8 is a sectional view of a memory cell unit of a nonvolatile semiconductor memory device according to a fourth embodiment.

FIG. 8 is a sectional view of a memory cell unit of the nonvolatile semiconductor memory device according to the present embodiment.

The memory cell is formed, for example, on the n-type silicon semiconductor layer 10 containing n-type impurities. The organic molecular layer 14 is provided on the semiconductor layer 10, and the control gate electrode 18 is provided on the organic molecular layer 14. The source region 20 and the drain region 22 are formed in the semiconductor layer 10 on both sides of the control gate electrode 18. A region below the control gate electrode 18 in the semiconductor layer 10 is the channel region 24. The channel region 24 is interposed between the source region 20 and the drain region 22.

As in the second embodiment, the organic molecular layer 14 has the function of the tunnel insulating layer. Further, the organic molecular layer 14 also has the function of the block insulating layer.

The second alkyl chain or the second alkyl halide chain of the second organic molecule 27 is provided with the insulating properties, and exerts the function as the block insulating layer.

The carbon number of the second alkyl chain or the second alkyl halide chain is not smaller than 6 and not larger than 30. It is desirably not smaller than 10 and not larger than 20. This is because, when the carbon number falls below the above range, the insulation properties might deteriorate. Further, when the carbon number exceeds the above range, the film thickness might become large, rendering the scaling-down being difficult.

It should be noted that the second alkyl chain or the second alkyl halide chain is desirably provided with a side chain diverging from a main chain to the control gate electrode side. It is because this configuration leads to an improvement in insulation properties brought by the second organic molecule 27.

As a material for the control gate electrode 18, a conductive material which provides favorable film characteristic by formed by ALD can be used, e.g., metals such as nickel (Ni) and titanium (Ti).

Figure 9:
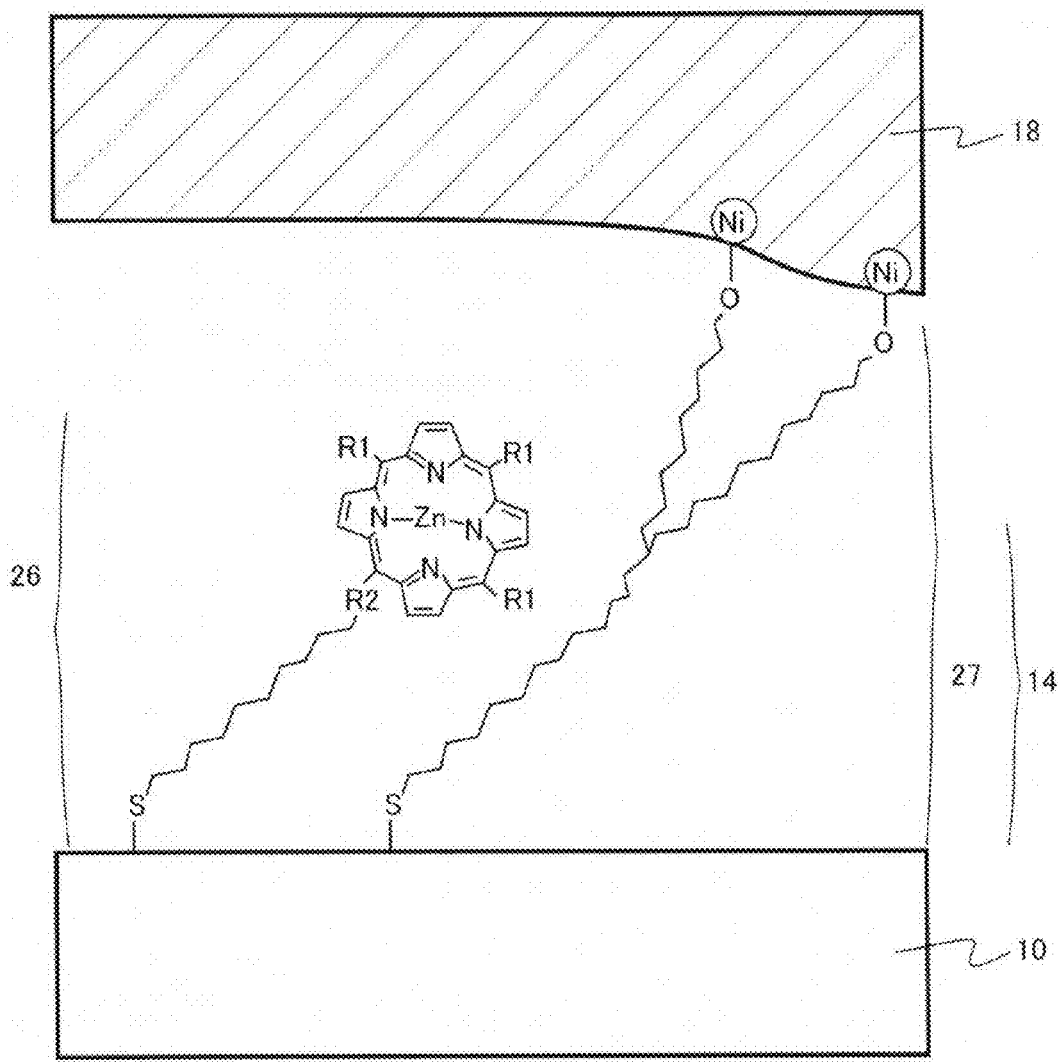
FIG. 9 is a diagram exemplifying organic molecules constituting an organic molecular layer according to the fourth embodiment.

FIG. 9 is a diagram exemplifying organic molecules constituting the organic molecular layer according to the present embodiment. The case of using nickel (Ni) as the control gate electrode 18 is exemplified here.

In the charge trapping molecule (first organic molecule) 26, the terminal group 26a is a thiol group, the charge trapping unit 26b is porphyrin, and the connecting unit 26c is the alkyl chain (first alkyl chain). In the seed molecule (second organic molecule) 27, the terminal group 27a is a thiol group, the head unit 27b is an ether group (—O—), and the connecting unit 27c is the alkyl chain (second alkyl chain).

The ether group of the head unit 27b of the seed molecule (second organic molecule) 27 is bonded with nickel (Ni) atoms of the control gate electrode 18.

The method for manufacturing the nonvolatile semiconductor device according to the present embodiment includes: forming the organic molecular layer 14 as a monolayer on the semiconductor layer 10 by self-assembling, the organic molecular layer 14 containing the first organic molecules 26 and the second organic molecules 27, the first organic molecule 26 having the first alkyl chain or the first alkyl halide chain and the charge trapping unit, the second organic molecule 27 having the second alkyl chain or the second alkyl halide chain and a hydroxy group, an ether group, a carboxyl group or an ester group; and forming the control gate electrode 18 on the organic molecular layer 14.

For example, the organic molecular layer 14 is formed on the semiconductor layer (semiconductor substrate) 10 of monocrystalline silicon. First, the first organic molecules 26 and the second organic molecules 27 are simultaneously or separately used to form the layer on the organic molecular layer 14 as a monolayer by self-assembling.

Then, the control gate electrode 18 is formed on the organic molecular layer 14 by ALD or the like.

The above is similar to that in the first embodiment except that the organic molecular layer 14 is formed directly on the semiconductor layer 10, and the control gate electrode 18 is formed directly on the organic molecular layer 14.

According to the present embodiment, the organic molecular layer 14 is made to play both functions of the tunnel insulating layer and the block insulating layer. Therefore, the physical film thickness of the memory cell structure can be small. Hence it is possible to realize the nonvolatile semiconductor device provided with the fine memory cell.

Further, eliminating the need for formation of the tunnel insulating layer of the inorganic material and the block insulating layer can realize simplification of the manufacturing process.

Fifth Embodiment

A nonvolatile semiconductor memory device according to the present embodiment is similar to that in the first embodiment except that a transistor of the memory cell is an n-type transistor whose carriers are electrons. Hence descriptions of contents that overlap with those of the first embodiment will be omitted.

Figure 10:
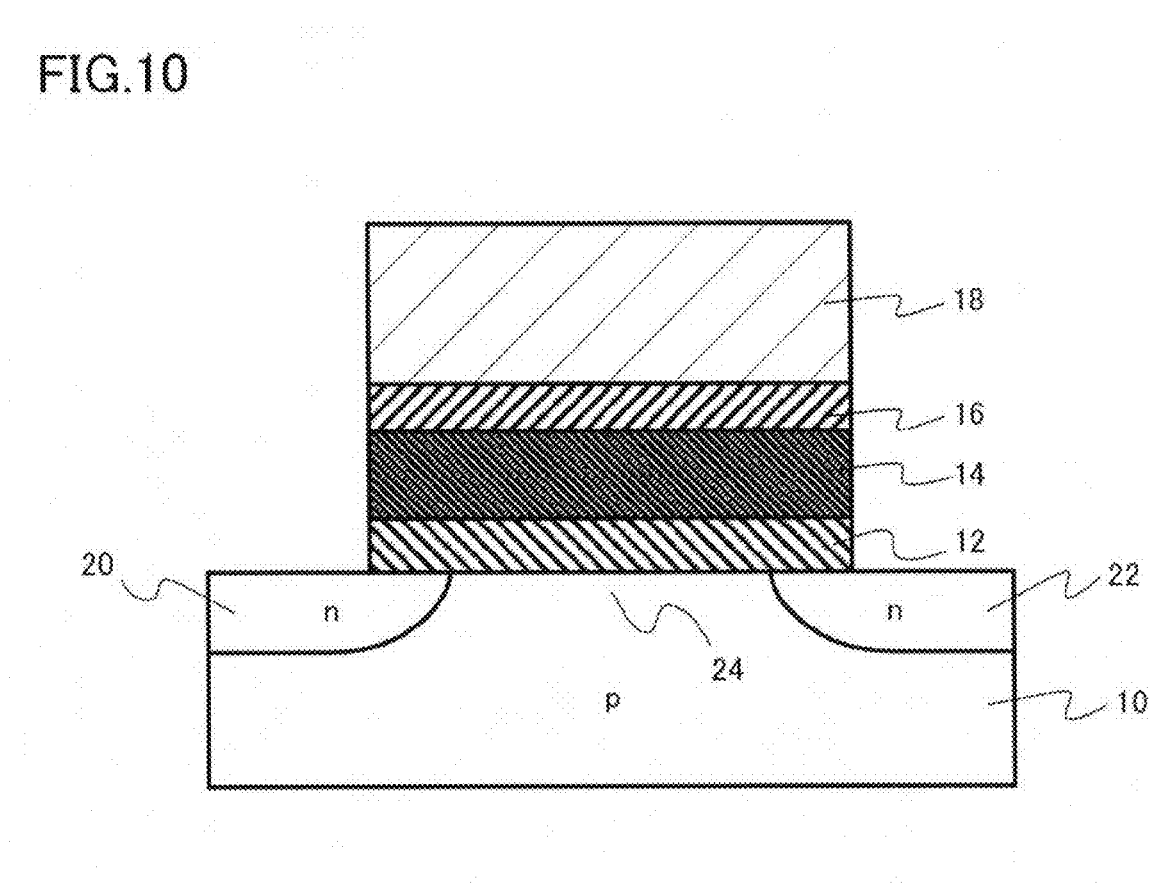
FIG. 10 is a sectional view of a memory cell unit of a nonvolatile semiconductor memory device according to a fifth embodiment.

FIG. 10 is a sectional view of a memory cell unit of the nonvolatile semiconductor memory device according to the present embodiment.

The memory cell is formed, for example, on the p-type silicon semiconductor layer 10 containing p-type impurities. The tunnel insulating layer 12 is provided on the silicon semiconductor layer 10, the charge trapping layer 14 is provided on the tunnel insulating layer 12, the block insulating layer 16 is provided on the charge trapping layer 14, and the control gate electrode 18 is provided on the block insulating layer 16. The source region 20 and the drain region 22 are formed in the semiconductor layer 10 on both sides of the control gate electrode 18. A region below the control gate electrode 18 in the semiconductor layer 10 is the channel region 24. The channel region 24 is interposed between the source region 20 and the drain region 22.

Moreover, the source region 20 and the drain region 22 are formed, for example, of n-type diffusion layers containing n-type impurities.

At the time of a writing operation of the memory cell according to the present embodiment, a voltage is applied between the control gate electrode 18 and the semiconductor layer 10 such that the control gate electrode 18 is at a relatively positive voltage, to store negative charges into the charge trapping layer 14. When the control gate electrode 18 is at a relatively positive voltage, an inversion layer is formed in the channel region 24 and electrons are accumulated thereinto. The electrons move in the tunnel insulating layer 12, and are stored in the charge trapping molecules of the charge trapping layer 14.

In this state, a threshold of the transistor of the memory cell is high as compared with the state of the electrons not being stored. That is, this is a state where the transistor is not likely to be turned on. This state is a state where data "0" has been written.

At the time of performing a data erasing operation, a voltage is applied between the control gate electrode 18 and the semiconductor layer 10 such that the control gate electrode 18 is at a relatively negative voltage. Due to an electric field between the control gate electrode 18 and the semiconductor layer 10, the electrons stored in the charge trapping layer 14 are transferred in the tunnel insulating layer 12 and are drawn to the semiconductor layer 10.

In this state, a threshold of a transistor of the memory cell is low as compared with that in the state of data "0". That is, this is a state where the transistor is likely to be turned on. This state is a state of data "1".

At the time of reading data, a voltage is applied between the source region 20 and the drain region 22. For example, in the state of data "0" where the electrons are stored, the threshold of the transistor is high, and hence the inversion layer is not formed in the channel region 24, and a current does not flow between the source and the drain.

On the other hand, in the erased state, namely in the state of data "1", the threshold of the transistor is low, and hence the inversion layer is formed in the channel region 24, and a current flows between the source and the drain. As thus described, sensing a current amount of the transistor makes it possible to read whether data is data "0" or data "1".

It should be noted that at the time of performing a data verifying operation, after performing the data writing operation, to determine whether the writing has been sufficiently performed, an operation similar to one at the time of the reading operation is performed. When a voltage is applied to between the source region 20 and the drain region 22, and a desired current does not flow, the data writing operation is performed again.

As thus described, the writing, erasing and reading operations are performed on the memory cell of the present embodiment, to function as the nonvolatile semiconductor memory device.

In the present embodiment, as the charge trapping molecule (first organic molecule) 26 in the charge trapping layer 14, for example, an organic molecule including the charge trapping unit 26b provided with a function to store electrons, such as a fullerene derivative, may be selected.

Similarly to the first embodiment, also in the present embodiment, using the charge trapping molecules and the seed molecules for the charge trapping layer allows realization of the nonvolatile semiconductor memory device excellent in charge retention properties and reliability.

Sixth Embodiment

A nonvolatile semiconductor memory device according to the present embodiment includes: a stacked structure in which insulating layers and control gate electrode layers are alternately stacked; a block insulating layer provided on the side surface of a hole arranged to penetrate the stacked structure from its top surface to the lowermost control gate electrode layer with respect to a stacking direction of the stacked structure; an organic molecular layer, which is formed on the inner surface of the block insulating layer, and contains first organic molecules and second organic molecules, and in which the first organic molecule has a first alkyl chain or a first alkyl halide chain on the block insulating layer side and a charge trapping unit on the opposite side to the block insulating layer side, and the second organic molecule has a second alkyl chain or a second alkyl halide chain on the block insulating layer side and a hydroxy group, an ether group, a carboxyl group or an ester group on the opposite side to the block insulating layer side; a tunnel insulating layer provided on the inner surface of the organic molecular layer; and a semiconductor layer provided on the inner surface of the tunnel insulating layer.

The nonvolatile semiconductor memory device according to the present embodiment differs from that of the first embodiment in that it is a three-dimensional device using so-called BiCS (Bit-Cost Scalable) technique. As for the configuration between the semiconductor layer and the control gate electrode, the present embodiment is similar to the first embodiment except that the organic molecular layer is not formed on the tunnel insulating layer, but formed on the block insulating layer as a self-assembled monolayer. Hence descriptions of contents that overlap with those of the first embodiment will be omitted.

Figure 11:
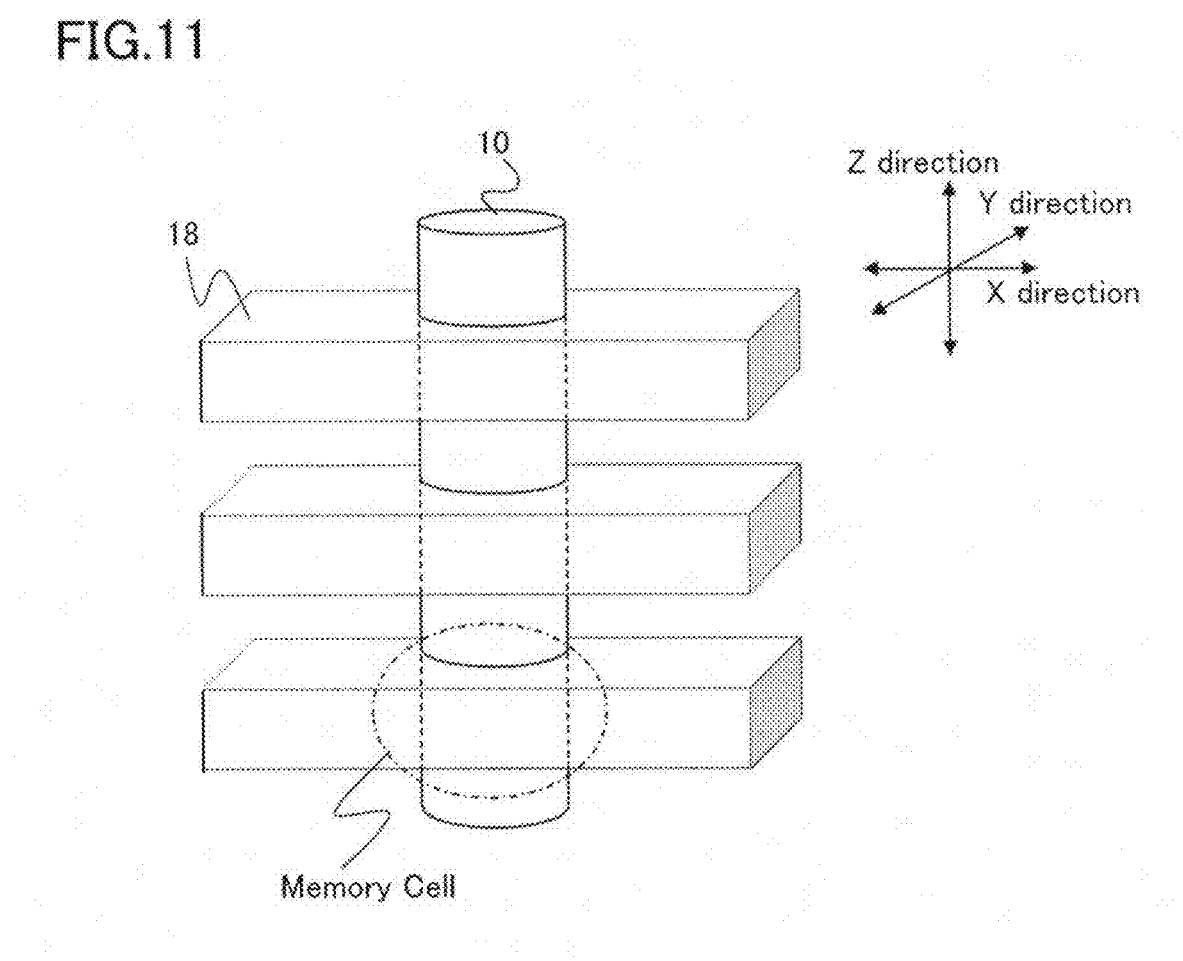
FIG. 11 is a three-dimensional conceptual diagram of a nonvolatile semiconductor memory device according to a sixth embodiment.
Figure 13:
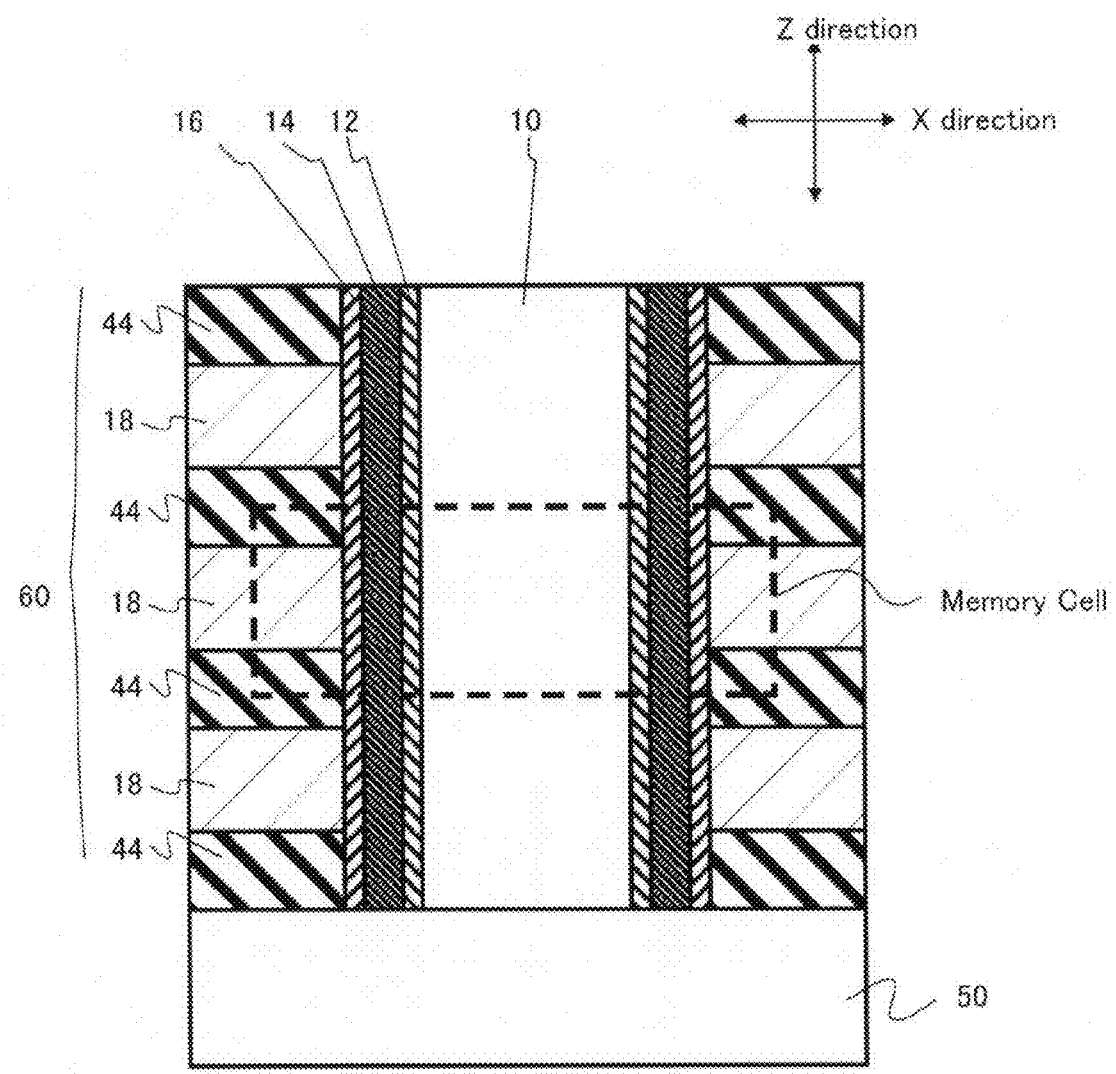
FIG. 13 is an X-Z sectional view of the nonvolatile semiconductor memory device of FIG. 17.

FIG. 11 is a three-dimensional conceptual diagram of the nonvolatile semiconductor memory device according to the present embodiment. FIG. 12 is an X-Y sectional view of FIG. 11. FIG. 13 is an X-Z sectional view of FIG. 11.

The nonvolatile semiconductor memory device according to the present embodiment is provided, for example, with a stacked structure 60 where a plurality of insulating layers 44 and control gate electrodes 18 are alternately stacked on a silicon substrate 50.

A hole is provided which penetrates the stacked structure 60 from its top to the lowermost control gate electrode 18. The block insulating layer 16 is provided on the side surface of the hole, and the charge trapping layer (organic molecular layer) 14 is provided on the inner surface of the block insulating layer 16.

Further, the tunnel insulating layer 12 is provided on the inner surface of the charge trapping layer 14. Moreover, the columnar semiconductor layer 10 is formed on the inner surface of the tunnel insulating layer 12.

In each of FIGS. 11 and 13, a region surrounded by a dashed line is the memory cell. The memory cell has a structure in which the tunnel insulating layer 12 is formed on the semiconductor layer 10, the charge trapping layer (organic molecular layer) 14 is formed on the tunnel insulating layer 12, and the control gate electrode 18 is formed on the charge trapping layer 14.

A method for manufacturing the nonvolatile semiconductor memory device according to the present embodiment includes: alternately depositing a plurality of insulating layers 44 and control gate electrode layers 18 on a substrate to form the stacked structure 60; forming a hole that penetrates the stacked structure 60 from its top surface to the lowermost control gate electrode 18; forming the block insulating layer 16 on the side surface of the hole; forming the organic molecular layer 14 as a monolayer on the inner surface of the block insulating layer 16 by self-assembling, the organic molecular layer 14 containing the first organic molecules 26 and the second organic molecules 27, the first organic molecule 26 having the first alkyl chain or the first alkyl halide chain and the charge trapping unit 26b, the second organic molecule 27 having the second alkyl chain or the second alkyl halide chain and a hydroxy group, an ether group, a carboxyl group or an ester group; forming the tunnel insulating layer 12 on the inner surface of the organic molecular layer 14; and; forming the semiconductor layer 10 on the inner surface of the tunnel insulating layer 12.

The tunnel insulating layer 12 is, for example, a silicon oxide layer, and can be formed using ALD. A desirable formation method is one where the organic molecular layer 14 formed of the organic molecules is not degraded, damage is small and a coverage inside the hole is high, and for example, thermal ALD is a desirable one.

The tunnel insulating layer 12 is formed on the organic molecular layer 19, to the surface of which the hydroxy group or the carboxyl group is exposed. Hence the high-quality tunnel insulating layer 12 is formed.

When the insulating layer after the film formation is annealed using the RTA device, an atomic density in the film increases, which is desirable.

In the nonvolatile semiconductor memory device according to the present embodiment, the high-quality tunnel insulating layer 12 can be realized by provision of the above configuration. This leads to an improvement in insulation properties between the charge trapping unit 26b and the semiconductor layer 10, thereby improving data retention properties. This also leads to an improvement in reliability of the tunnel insulating layer 12.

Further, according to the present embodiment, the memory cell is made three-dimensional, to increase the integration degree of the memory cell, thereby allowing realization of a nonvolatile semiconductor memory device with a higher integration degree than those of the first to fifth embodiments.

EXAMPLES

In the following, examples will be described.

Example 1

A layer structure corresponding to the first embodiment was created and evaluated.

Using a p-type silicon substrate, two-terminal device was made by the following method. A pulse voltage is applied to the device as writing of data, and capacitance properties before and after the write operation are measured, whereby it is possible to check a charge storage amount and charge retention property.

The p-type silicon substrate was introduced into a thermal oxidization furnace, to form a silicon oxide layer on its surface. A thickness of the silicon oxide layer was 5 nm as a result of measuring the film thickness. aluminum oxide ($Al_2O_3$) was formed on this substrate in one cycle, using ALD.

Subsequently, the surface of the formed silicon oxide layer was irradiated to clean by a UV cleaner for ten minutes. The cleaned substrate was put into a toluene/ethanol mixed solution (mixed ratio of 1:1) obtained by dissolving a decylporphyrin derivative (porphyrin derivative bonded with an alkyl chain of C10) as the charge trapping molecules in a concentration of 1 mM, and 11-Phosphonoundecanoic acid as the seed molecules in a concentration of 0.1 mM, and was kept in that solution overnight.

Thereafter, the substrate was removed and transferred into a fresh toluene/ethanol mixed solution, and then rinsed by the ultrasonic cleaner for a minute. It is to be noted that the rinsing operation using the mixed solution was performed twice in total as the mixed solution was replaced by a new one.

Thereafter, the rinsed substrate was transferred into pure ethanol, rinsed by the ultrasonic cleaner for a minute, and then dried using a nitrogen blower.

Subsequently, the substrate was introduced into a thermal ALD device, to form a hafnium oxide film at 150° C. on the surface where the decylporphyrin derivative and 11-Phosphonoundecanoic acid were mixed and adsorbed. A thickness of the hafnium oxide layer was about 10 nm as a result of measuring the layer thickness.

Then, the back surface of the substrate was soaked in a rich hydrofluoric acid aqueous solution to remove an unnecessary oxide layer formed on the back surface, and rinsed by pure water. Thereafter, aluminum was deposited on the back surface, to give an electrode on the substrate side. Further, gold was deposited on the top surface of hafnium oxide of the substrate through a metal mask opened with a hole, to give a control gate electrode. Finally, it was introduced into the RTA device, and annealed under a $N_2$ gas atmosphere mixed with 3% of $H_2$ at 300° C. for 30 minutes, to made a two-terminal device.

Example 2

As in Example 1, a film structure corresponding to the first embodiment was created and evaluated. However, the concentration of the second organic molecules (seed molecules) was changed from 0.1 mM in Example 1 to 1 mM. Descriptions other than that of the concentration of the seed molecules are omitted since being similar to in Example 1.

Example 3

As in Example 1, a layer structure corresponding to the first embodiment was created and evaluated. However, the concentration of the second organic molecules (seed molecules) was changed from 0.1 mM in Example 1 to 10 mM. Descriptions other than that of the concentration of the seed molecules are omitted since being similar to in Example 1.

Comparative Example

In contrast to Examples 1, 2 and 3, a layer structure, provided only with the first organic molecules (charge trapping molecules) and not provided with the second organic molecules (seed molecules), was created and evaluated.

The p-type silicon substrate was introduced into a thermal oxidization furnace, to form a silicon oxide layer on its surface. The thickness of the silicon oxide layer was 5 nm as a result of measuring the layer thickness. Aluminum oxide ($Al_2O_3$) was formed on this substrate in one cycle, using ALD.

Subsequently, the surface of the formed silicon oxide layer was irradiated to clean by a UV cleaner for ten minutes. The cleaned substrate was put into a dehydrated toluene solution obtained by dissolving the decylporphyrin derivative in a concentration of 1 mM. The substrate was kept in that solution overnight.

Thereafter, the substrate was taken out and moved into pure toluene, and then rinsed by an ultrasonic cleaner for a minute.

It is to be noted that this rinsing operation was performed twice in total as toluene was replaced by new one.

The substrate rinsed by toluene was transferred into pure ethanol, rinsed by the ultrasonic cleaner for a minute, and then dried using the nitrogen blower.

Subsequently, as in Example 1, a hafnium oxide layer was formed by thermal-type ALD. A thickness of the hafnium oxide layer was about 10 nm as a result of measuring the layer thickness.

Then, the back surface of the substrate was immersed in concentrated hydrofluoric acid to remove an unnecessary oxide film formed on the back surface, and rinsed by pure water. Thereafter, aluminum was deposited on the back surface, to give an electrode on the substrate side. Further, gold was deposited on the top surface of hafnium oxide of the substrate through a metal mask opened with a hole, to give a gate electrode. Finally, it was introduced into the RTA device, and annealed under a $N_2$ gas atmosphere mixed with 3% of $H_2$ at 300° C. for 30 minutes, to produce a two-terminal device.

The aluminum electrode on the back surface of each of the devices of Examples 1 to 3 and Comparative Example was contacted to the measurement stage. And measurement probe was contacted to the metal electrode on the upper surface. Then a voltage was applied to the examples. Capacitance measurement was carried out on each of the devices while the voltage was varied. A pulse voltage was then applied to each of the devices, and data writing was performed. Capacitance measurement was again performed while the voltage was varied, to measure the amount of stored charges.

Figure 14:
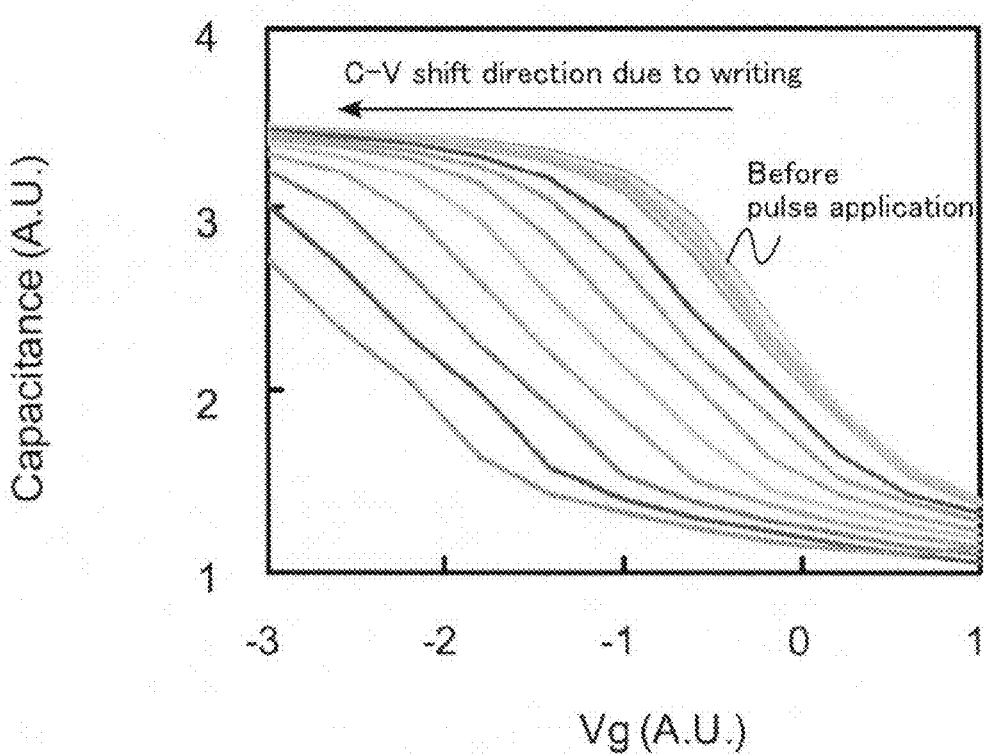
FIG. 14 is a diagram showing results of capacitance measurement in Example 1.

FIG. 14 is a graph showing results of the capacitance measurement in Example 1. The capacitance measurement was performed on the device of Example 1, and results are shown which were obtained by changing pulse writing, with a writing voltage width of 100 ms, by 0.4 V step from −5 V to −14 V, and sequentially applying it to the gold gate electrode, to perform the capacitance measurement in each applying.

A capacitance saturated region was seen, and it was confirmed that a threshold voltage (flat band voltage) for saturated region shifted in a minus bias direction. This flat band voltage shift indicates that, due to the pulse voltage applied from the gold gate electrode, positive charges (holes) are transferred from the p-type silicon substrate to the charge trapping layer, and the positive charges are stored in the charge trapping layer.

A value of this flat band voltage shift was multiplied by a value obtained by subtracting a value of the capacitance of silicon oxide from the maximum value of the capacitance, to give a density of the charges stored in the charge trapping layer. It is to be noted that the capacitance of silicon oxide was calculated by fixing a dielectric constant of silicon oxide to 3.9.

Figure 15:
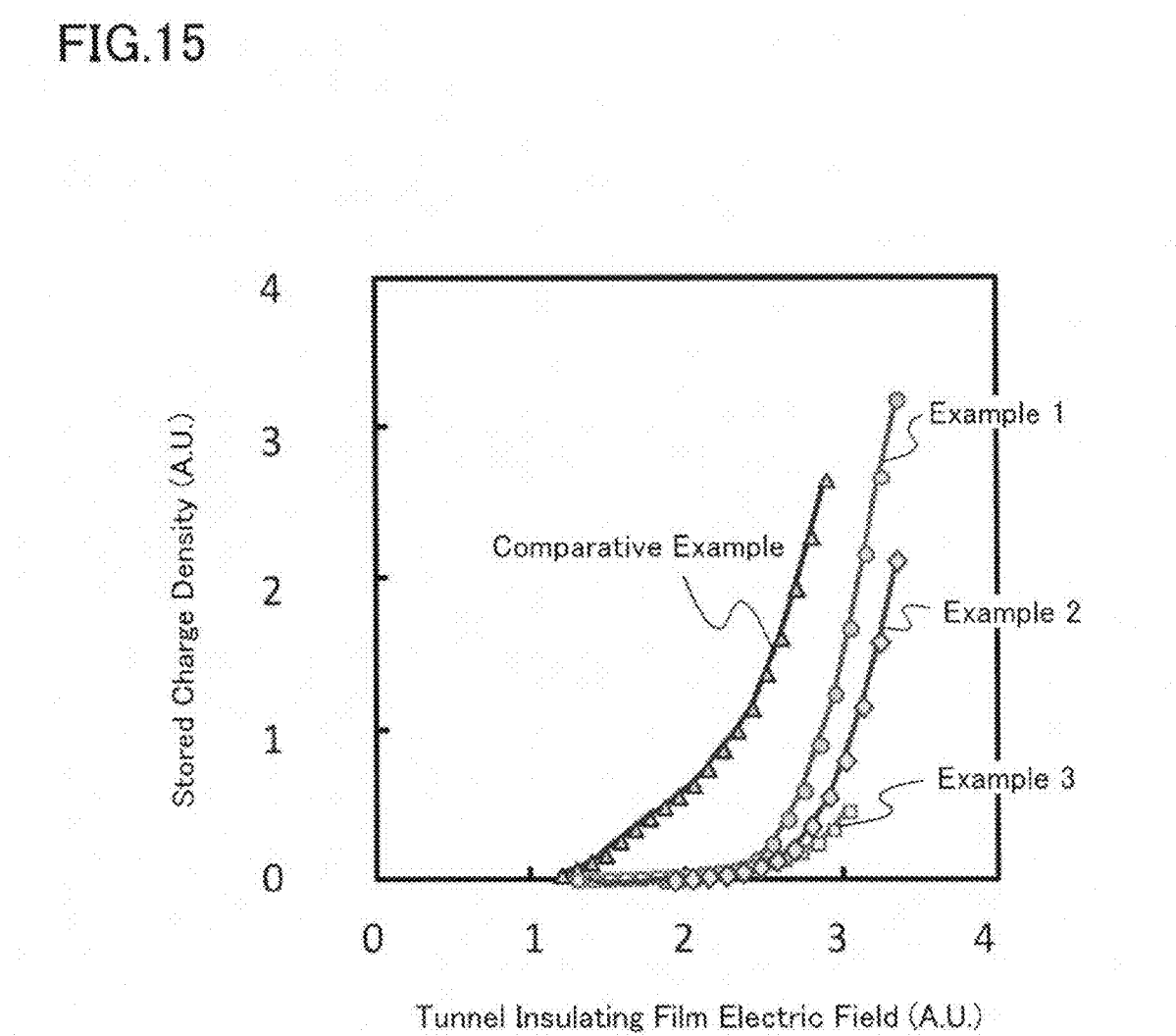
FIG. 15 is a diagram showing dependency of a stored charge density on an applied electric field in each of Examples 1 to 3 and Comparative Example.

FIG. 15 is a graph showing dependency of the stored charge density on the applied electric field in each of Examples 1 to 3 and Comparative Example. In the case of each of the devices of Examples 1 to 3 and Comparative Example, the pulse voltage was applied to the gold control gate electrode, while the voltage was changed, for applying pulse time of 100 ms. Then, a shift amount of the flat band voltage of the capacitance after applying of the pulse voltage was measured by calculation in a similar manner to the foregoing method, and this value was multiplied by a value obtained by subtracting a value of the capacitance of silicon oxide from the maximum value of the capacitance, to give an estimated stored charge density. A graph is shown where a vertical axis indicates the stored charge density and a horizontal axis indicates the value calculated as strength of an electric field that was applied to the tunnel insulating layer of silicon oxide by applying of the pulse voltage.

As a result, as seen in FIG. 15, it is found that positive charges were stored by applying of the pulse voltage in all Examples 1 to 3 and Comparative Example. And, it is found that a breakdown voltage increases in each of Examples 1 to 3 as compared with Comparative Example. It is considered that this is because the film quality of the hafnium oxide corresponding to the block insulating layer was improved.

Further, in comparison among each of Examples 1 to 3, the stored charge density of Example 1 is the largest, that of Example 2 is the second largest, and that of Example 3 is the smallest. This is because, the probability of adsorption of the seed molecules increases due to increase in concentration of the seed molecules, and an amount of the charge trapping molecules contained in the charge trapping layer decreases. When Zn peak areas derived from the charge trapping molecules by means of X-ray photoemission spectroscopy were compared, results were 28% in Example 1, 27% in Example 2 and 20% in Example 3 with respect to Comparative Example. In the case of the charge trapping molecules charging, Coulomb's repulsion between the stored charges also needs to be considered. Hence the Zn peak area and the stored charge density are not necessarily in a linear proportional relation. However, it is desired to improve the properties while suppressing the decrease in stored charge density. It was therefore found that, when the charge trapping molecules and the seed molecule were adsorbed in the same process, a mixing ratio of those was also important. Specifically, it was indicated that the seed molecule concentration may be at least not larger than 10% with respect to the charge trapping molecule concentration.

Next, the retention properties were measured for the stored charges in Comparative Example and in Example 1 where the stored charge density was equivalent to or larger than that of Comparative Example. The retention time for the stored charges was evaluated in such a manner that, as in FIG. 14, a flat band voltage value of the capacitance shifted by applying of the pulse voltage was measured, after leaving for a certain period of time by performing the capacitance measurement again, to determine how much attenuation has been made.

Figure 16:
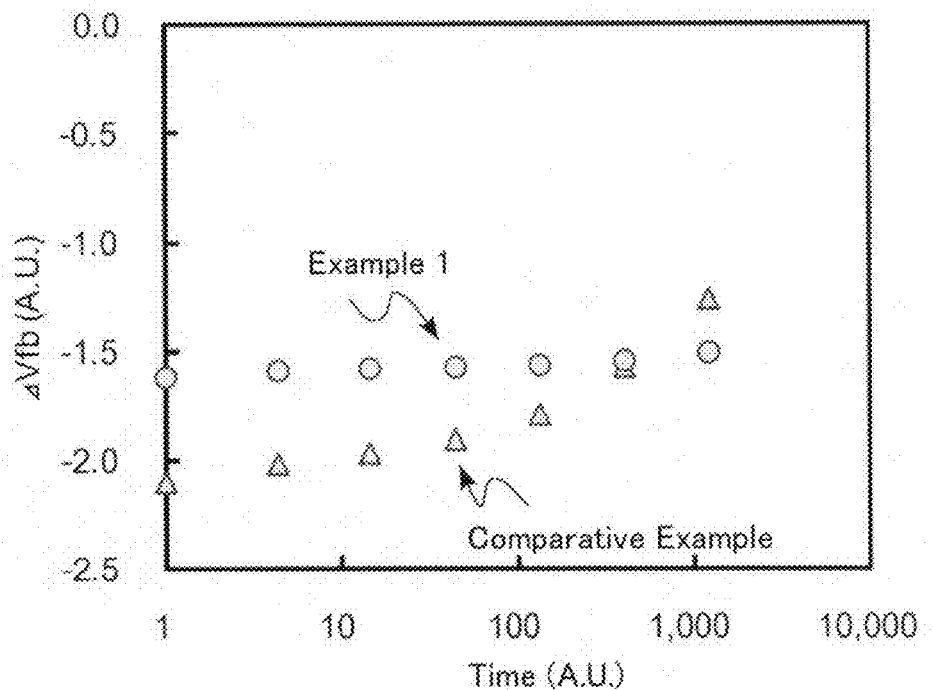
FIG. 16 is a diagram showing charge retention properties in Example 1 and Comparative Example.
Figure 17:
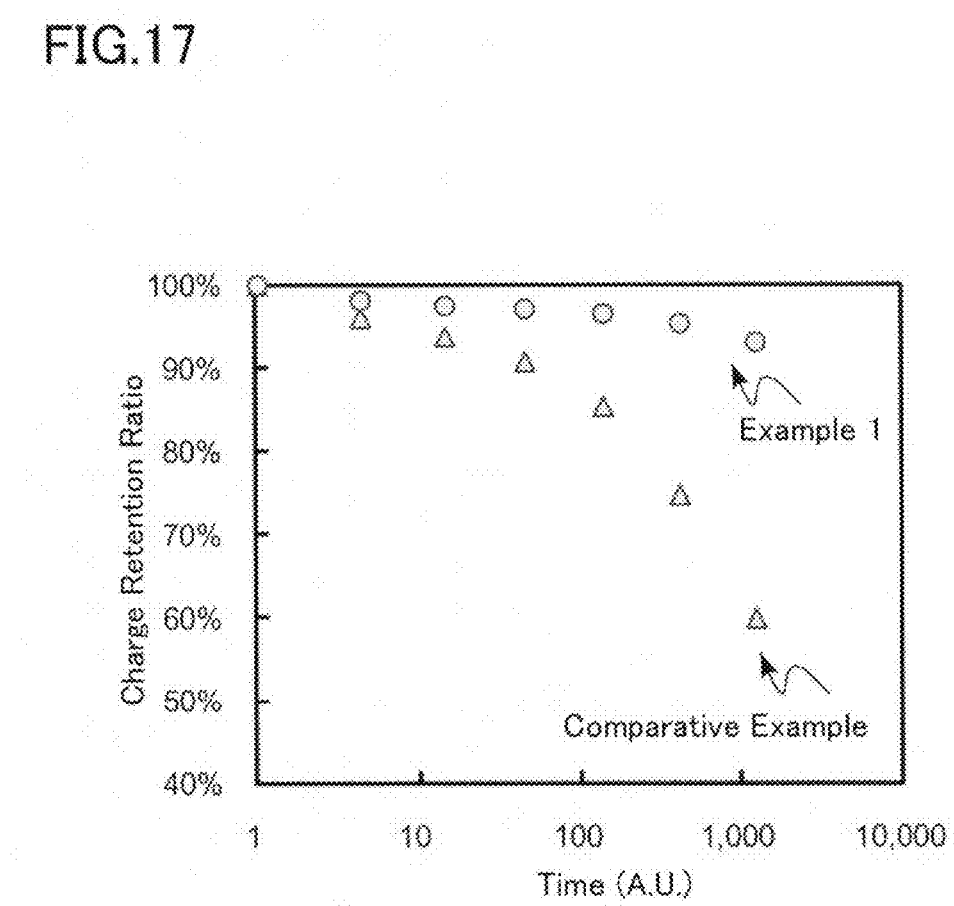
FIG. 17 is a diagram showing charge retention ratios in Example 1 and Comparative Example.

FIGS. 16 and 17 are diagrams showing charge retention properties in Example 1 and Comparative Example. In Example 1 and Comparative Example, the pulse voltage was controlled and applied to the gold control gate electrode such that the stored charge density was constant in Example 1 and Comparative Example, and a flat band voltage ($V_{FB}$) of the capacitance shifted by storage of the positive charges was determined by performing the capacitance measurement again after a certain period of time.

FIG. 16 is a graph where the shifted flat band voltages are plotted with respect to the elapsed time. An approximate line was drawn by a logarithm with respect to the plotted dots, to determine the time until the attenuation by 5% from the initial flat band voltage shifted value measured immediately after the pulse voltage applying was observed. Further, FIG. 17 is a graph where ratios of the stored charges are plotted with respect to the elapsed time.

The time until the flat band voltage shift($\Delta V_{FB}$) attenuated by 5% in Example 1 was 47 times as long as that in Comparative Example, and it was thus found that the retention time for the stored charges was long, namely the retention properties were superior, in Example 1 as compared with of Comparative Example.

While certain embodiments have been described, these embodiments have been presented by way of example only, and are not intended to limit the scope of the inventions. Indeed, non-volatile semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a stacked structure having insulating layers and control gate electrode layers, the insulating layers and the control gate electrode layers being alternately stacked;
    a block insulating layer provided on the side surface of a hole penetrating the stacked structure from its top surface to the lowermost control gate electrode layer with respect to a stacking direction of the stacked structure;
    an organic molecular layer formed on the inner surface of the block insulating layer, the organic molecular layer including first organic molecules and second organic molecules, the first organic molecules and the second organic molecules co-existing in the organic molecular layer, the first organic molecules having a first alkyl chain or a first alkyl halide chain and a charge trapping unit, and the second organic molecules having a second alkyl chain or a second alkyl halide chain and a hydroxy group, an ether group, a carboxyl group or an ester group;
    a tunnel insulating layer provided on the inner surface of the organic molecular layer; and
    a semiconductor layer provided on the inner surface of the tunnel insulating layer.

2. The device according to claim 1, wherein the concentration of the second organic molecules is not larger than 10% of the concentration of the first organic molecules.

3. The device according to claim 1, wherein the carbon number of the second alkyl chain or the second alkyl halide chain is not smaller than 3 and not larger than 30.

4. The device according to claim 1, wherein the charge trapping unit is a porphyrin derivative, a phthalocyanine derivative, a chlorine derivative, a tetrapyrrole derivative, a bipyridine derivative, an indole derivative, an acene derivative, a quinoxaline derivative, a phenylenevinylene derivative, or a fullerene derivative.

5. The device according to claim 1, wherein the block insulating layer is a metal oxide film formed by ALD (Atomic Layer Deposition).

6. A memory device, comprising:
    a stacked structure having insulating layers and control gate electrode layers, the insulating layers and the control gate electrode layers being alternately stacked;
    a semiconductor layer provided on the stacked structure, the semiconductor layer extending from the lowermost one of the control gate electrode layers to the uppermost one of the control gate electrode layers;
    a first insulating layer provided between the semiconductor layer and one of the control gate electrode layers;
    a organic molecular layer provided between the semiconductor layer and the first insulating layer, the organic molecular layer including first organic molecules and second organic molecules, the first organic molecules and the second organic molecules co-existing in the organic molecular layer, the first organic molecules having a first alkyl chain or a first alkyl halide chain and a charge trapping unit, and the second organic molecules having a second alkyl chain or a second alkyl halide chain and a hydroxyl group, an ether group, a carboxyl group or an ester group; and second insulating layer provided between the semiconductor layer and the organic molecular layer.

* * * * *